(12) United States Patent
Nagaoka

(10) Patent No.: US 6,316,812 B1
(45) Date of Patent: Nov. 13, 2001

(54) STATIC SEMICONDUCTOR MEMORY DEVICE WITH EXPANDED OPERATING VOLTAGE RANGE

(75) Inventor: Hideaki Nagaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/564,669

(22) Filed: May 4, 2000

(30) Foreign Application Priority Data

Nov. 15, 1999 (JP) .................................................. 11-324381

(51) Int. Cl.[7] ........................... H01L 29/76; H01L 29/94; H01L 31/062; H01L 31/113; H01L 31/119
(52) U.S. Cl. ........................... 257/369; 257/379; 257/903; 257/904; 365/189.05; 365/189.08; 365/189.09; 365/205; 365/230.08
(58) Field of Search ..................................... 257/369, 379, 257/903, 904; 365/189.05, 189.08, 189.09, 205, 230.08

(56) References Cited

U.S. PATENT DOCUMENTS 6,067,256 * 5/2000 Yamashita et al. ............. 365/189.04
6,075,749 * 6/2000 Isa ........................................ 365/233
6,222,757 * 4/2001 Rau et al. ............................ 365/154

FOREIGN PATENT DOCUMENTS 2 248 131   3/1992   (GB) .
4-132080    5/1992   (JP) .
10-199242   7/1998   (JP) .

* cited by examiner

*Primary Examiner*—Ngân V. Ngô
(74) *Attorney, Agent, or Firm*—McDermott, Will & Emery

(57) ABSTRACT

A memory cell power supply circuit includes: a memory cell power supply PMOS transistor connected between a power supply node and a power supply potential, a diode-connected transistor provided between a gate of the memory cell power supply transistor and the power supply potential, and a resistor provided between the gate of the memory cell power supply transistor and a ground potential. During a writing operation when a value of current flowing to the memory cell is high, if the power supply potential increases, a cell power supply potential down-converted by a greater amount is supplied to the memory cell.

13 Claims, 20 Drawing Sheets

NON-SELECTED ROW DURING STAND-BY/READING OPERATION
OR DURING WRITING OPERATION

SELECTED ROW DURING READING OPERATION/SELECTED ROW AND NON-SELECTED COLUMN DURING WRITING OPERATION

STATIC SEMICONDUCTOR MEMORY DEVICE WITH EXPANDED OPERATING VOLTAGE RANGE

BACKGROUND OF THE INVENTION

1. Field of the Invention

The present invention relates to structures of static semiconductor memory devices having memory cells including MOS transistors and, more specifically to a structure of a memory cell power supply circuit for a static semiconductor memory device.

2. Description of the Background Art

FIG. 16 is a circuit diagram showing a structure of a memory cell for a static random access memory (hereinafter abbreviated as an SRAM) including a conventional MOS transistors.

Referring to FIG. 16, the conventional memory cell includes a P channel MOS load transistor P11 and an N channel MOS driver transistor N11 connected in series between power supply potentials Vcc and ground potentials GND as well as a P channel MOS load transistor P12 and an N channel MOS driver transistor N12 connected in series between power supply potentials Vcc and ground potentials GND. A connection node between P channel MOS load transistor P11 and N channel MOS driver transistor N11 is referred to as a storage node nm1, whereas a connection node between P channel MOS load transistor P12 and N channel MOS driver transistor N12 is referred to as a storage node nm2.

Transistors P11 and N11 have their gates connected to storage node nm2, and transistors P12 and N12 have their gates connected to storage node nm1.

The conventional memory cell further includes an N channel MOS access transistor Tra1 arranged between a bit line BL and storage node nm1 and having its gate potential controlled by a word line WL, and an N channel MOS access transistor Tra2 arranged between storage node nm2 and a bit line /BL and having its gate potential controlled by word line WL.

Now, each operating state of the memory cell will be described in terms of a current flowing from a memory cell power supply source, i.e., a power supply source supplying a power supply potential to sources of load PMOS transistors P11 and P12 of the memory cell.

FIG. 17 is a diagram shown in conjunction with a current flowing to all memory cells in a stand-by mode or to the memory cell in a non-selected row in a reading/writing operation mode.

In this state, N channel MOS access transistors Tra1 and Tra2 are in a cut-off state because word line WL is at an "L" level.

P channel MOS load transistor P11 on the side of storage node nm1 with "H" level data is in a conductive state, whereas N channel MOS driver transistor N11 is in the cut-off state. Thus, only a leakage current in an off state (hereinafter referred to as an off leakage current) of N channel MOS driver transistor N11 is applied from memory cell power supply source Vcc to the memory cell.

Further, N channel MOS driver transistor N12 on the side of node nm2 with "L" level data is in the conductive state, whereas P channel MOS load transistor P12 is in the cut off state. Thus, only an off leakage current of P channel MOS transistor P12 is applied from the memory cell power supply source to the memory cell.

FIG. 18 is a diagram shown in conjunction with a current flowing to a memory cell in a selected row during a reading operation as well as in a selected row and non-selected column during a writing operation.

The portion on the side of storage node nm with the "H" level data will be described.

P channel MOS load transistor P11 is in the conductive state, whereas N channel MOS driver transistor N11 is in the cut off state. Thus, only an off leakage current of N channel MOS transistor N11 is applied from the memory cell power supply source to the memory cell.

Although word line WL is at the "H" level, a gate, drain, and source of N channel MOS access transistor Tra1 are all at the "H" level as bit line BL is also precharged to the "H" level. Thus, a current is not supplied between the memory cell and bit line BL.

Next, the portion on the side of storage node nm2 with the "L" level data will be described.

N channel MOS driver transistor N12 is in the conductive state, whereas P channel MOS load transistor P12 is in the cut off state. Thus, only an off leakage current of P channel MOS load transistor P12 is applied from the memory cell power supply source to the memory cell.

As word line BL is at the "H" level and the bit line is also precharged to the "H" level, a gate and drain of N channel MOS access transistor Tra2 are both at the "H" level and a source thereof is at the "L" level. Thus, a column current Ic is supplied from bit line /BL toward storage node nm2 as indicated by an arrow in FIG. 18 and then supplied to ground GND via driver transistor Tra2.

However, a power supply potential for precharging bit line /BL to the "H" level and a power supply potential to the memory cell are supplied from separate paths, so that only the off leakage current of P channel MOS load transistor P 12 is applied from the memory cell power supply source.

FIG. 19 is a diagram shown in conjunction with a current supplied to a memory cell to be rewritten in a selected row and in a selected column during a writing operation. First, the portion on the side to be changed from the "L" level to the "H" level (on the side of storage node nm1) will be described.

P channel MOS load transistor P11, initially in the cut off state, is brought into the conductive state as the level of storage node nm2 which is connected to P channel MOS transistor P12 paired with P channel MOS load transistor P11 is changed from the "H" to "L" level.

N channel MOS driver transistor Nil, initially in the conductive state, is brought into the cut off state as the level of storage node nm2 on the side of N channel MOS driver transistor N12 paired with N channel MOS driver transistor N11 is changed from the "H" to "L" level.

As word line WL is at the "H" level and bit line BL is precharged to the "H" level, initially, a gate and drain of N channel MOS access transistor Tra1 are both at the "H" level and a source thereof is at the "L" level. Thus, a current Ic is supplied from bit line BL to storage node nm1 as indicated by an arrow shown in FIG. 19, and supplied to ground GND via a driver transistor. However, when N channel MOS driver transistor N11 is brought into the cut off state, the flow of current Ic sooner or later stops.

A power supply potential for precharging bit line BL to the "H" level and a power supply potential of the memory cell are supplied by separate paths, so that only an off leakage current of P channel MOS load transistor P11 is initially supplied from the memory cell power supply source and only an off leakage current of N channel MOS transistor N11 is supplied from the memory cell power supply source after the writing operation.

Next, the portion on the side to be written from the "H" to "L" level (on the side of storage node nm2) will be described.

P channel MOS load transistor P12 is initially in the conductive state, but brought into the cut off state as the level of storage node nm1 on the other side is changed from the "L" to "H" level.

N channel MOS driver transistor N12 is initially in the cut off state, but brought into the conductive state as the level of storage node nm1 on the other side is changed from the "L" to "H" level.

Word line WL is at the "H" level, and bit line /BL has been brought down to be "L" level by a writing driver. Thus, a gate and drain of N channel MOS access transistor Tra2 are both at the "H" level, and a source thereof is at the "L" level, so that a current Imc is supplied from the memory cell power supply source to the storage node via a load transistor and further supplied to bit line /BL as indicated by an arrow. The flow of current Imc sooner or later stops as P channel MOS load transistor P12 is brought into the cut off state.

Such a current Imc flowing from the memory cell power supply source to the memory cell is only generated for the memory cell to be rewritten in the selected row and in the selected column during the writing operation. In addition, such a significant current Imc is generated after word line WL rises and the bit line attains to the "L" level by a write driver and until the latched data of the memory cell is inverted and the writing operation is completed.

FIG. 20 is a diagram showing a relationship between a current flowing from the memory cell power supply source to the memory cell and a power supply voltage of the memory cell.

More specifically, a greater amount of current is always supplied to the memory cell from the memory cell power supply source during the writing operation than during the reading operation. In addition, as memory cell power supply voltage Vcc increases with an increase in an externally supplied power supply voltage, the current supplied from the memory cell power supply source during the writing operation more dramatically increases.

There may be an upper limit to the voltage allowing the writing operation and an operating voltage of the device is thereby disadvantageously restricted, due to a property of the memory cell.

FIG. 21 is a schematic diagram shown in conjunction with a case where an upper limit to the power supply voltage enabling the operation of the memory cell is restricted by the presence of parasitic resistance when memory cell power supply voltage Vcc is relatively high during the writing operation.

As shown in FIG. 21, when there is a high parasitic resistance Rp11 or Rp21 due to some reason, a potential at storage node nm1 or nm2 is determined by a voltage division by the resistance from memory cell power supply voltage Vcc to a ground potential.

Thus, even if the level of bit line /BL on the side rewriting to the "L" level is brought down to the "L" level, a potential at storage node nm2 cannot be brought down to a logic threshold value of an inverter including driver transistor P11 and load transistor N11 on the side of the other bit line BL. As a result, the writing operation for inverting the latched data cannot be performed. This tendency is even more significant when memory cell power supply voltage Vcc is high, which corresponds to the case where equivalent resistance of load transistor P11 or P12 is relatively small.

FIG. 22 is a diagram shown in conjunction with the case where a lower limit to an operating voltage of the device is restricted when memory cell power supply voltage Vcc is low during a reading operation.

In the reading operation, generally, the lower limit to memory cell power supply voltage Vcc of the device tends to be restricted.

FIG. 22 is a diagram shown in conjunction with an output potential with respect to an input potential of the memory cell inverter when word line WL is risen, in connection with two inverters forming a latch in the memory cell.

Each of circles in FIG. 22 is referred to as a static noise margin (SNM). The larger circle indicates that the reading operation is more stabilized.

As shown in FIG. 22, when power supply voltage Vcc is low, SNM is small. In this case, stability of the reading operation is lower than in the case where memory cell power supply voltage Vcc is high.

As described above, the upper limit of the voltage enabling operation of the device is restricted by the writing operation, and the lower limit of the range of the memory cell power supply voltage enabling operation of the device is restricted by the reading operation. As a result, in the conventional static semiconductor memory device, it is difficult to ensure a sufficient range of the operating voltage.

On the other hand, disclosed in Japanese Patent Laying-Open No. 4-132080 is a structure in which a circuit providing power supply to the memory cell is arranged between memory cell power supply Vcc and a high-resistance load memory cell in order to reduce a stand-by current of the high-resistance load memory cell.

In a circuit structure shown in FIG. 4 of the aforementioned laid-open application No. 4-132080, however, an IDSS of a memory cell power supply PMOS transistor outputting a potential to be supplied to the memory cell merely corresponds to an upper limit of a stand-by current of the memory cell array to which the memory cell power supply PMOS transistor is connected. As described above, in a full CMOS memory cell, data cannot be written to the memory cell during the writing operation with high power supply voltage Vcc because a driving force of a load PMOS is too high. The problem that the data cannot be written to the memory cell nor a solution therefor is not described in the aforementioned application.

SUMMARY OF THE INVENTION

An object of the present invention is to provide a static semiconductor memory device with an expanded operating voltage range of a device achieved by increasing an upper limit of the operating voltage of the device which is restricted by a writing operation of a memory cell while ensuring a sufficiently low operating voltage of the device which is otherwise restricted by a reading operation of the memory cell.

In short, the present invention includes a memory cell array, a plurality of word lines, a plurality of pairs of bit lines, and a cell power supply circuit.

The memory cell array includes a plurality of memory cells arranged in a matrix. The plurality of word lines are arranged correspondingly to rows of the memory cells. The plurality of pairs of bit lines are arranged correspondingly to the columns of the memory cells.

Each memory cell includes a first access transistor, a second access transistor, and a latch circuit.

The first access transistor is arranged between one of the pair of bit lines and the first storage node, and controlled by the corresponding word line. The second access transistor is arranged between the other of the pair of bit lines and the second storage node, and controlled by the corresponding word line. The latch circuit includes first and second storage nodes, a first CMOS inverter having an input node connected to the second storage node and an output node connected to the first storage node, and a second CMOS inverter having an input node connected to the first storage node and an output node connected to the second storage node.

The cell power supply circuit generates a memory cell power supply potential supplied to the latch circuit. The cell power supply circuit includes at least one cell power supply MOS transistor arranged between the power supply potential and an output of the cell power supply circuit, and a gate potential control circuit controlling a gate-source voltage of the cell power supply MOS transistor such that it is at most a prescribed value.

The cell power supply MOS transistor is sized to supply a current value enabling a data writing operation for at most a single latch circuit.

Preferably, the cell power supply MOS transistor is a P channel MOS transistor having its source connected to a power supply potential. The gate power supply control circuit includes at least one bias diode connected in series between the power supply potential and a gate of the cell power supply MOS transistor, and a first bias resistor connected between a gate of the cell power supply MOS transistor and a prescribed potential lower than the power supply potential.

Therefore, a main advantage of the present invention is that the cell power supply potential supplied to the memory cell during the writing operation is down-converted from the power supply potential by a greater amount even in the case of the high power supply voltage, so that a range of an operating voltage of the device can be expanded by increasing an upper limit of the operating voltage of the device which is restricted by the writing operation of the memory cell while ensuring a sufficiently low operating voltage of the device which is otherwise restricted by the reading operation of the memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
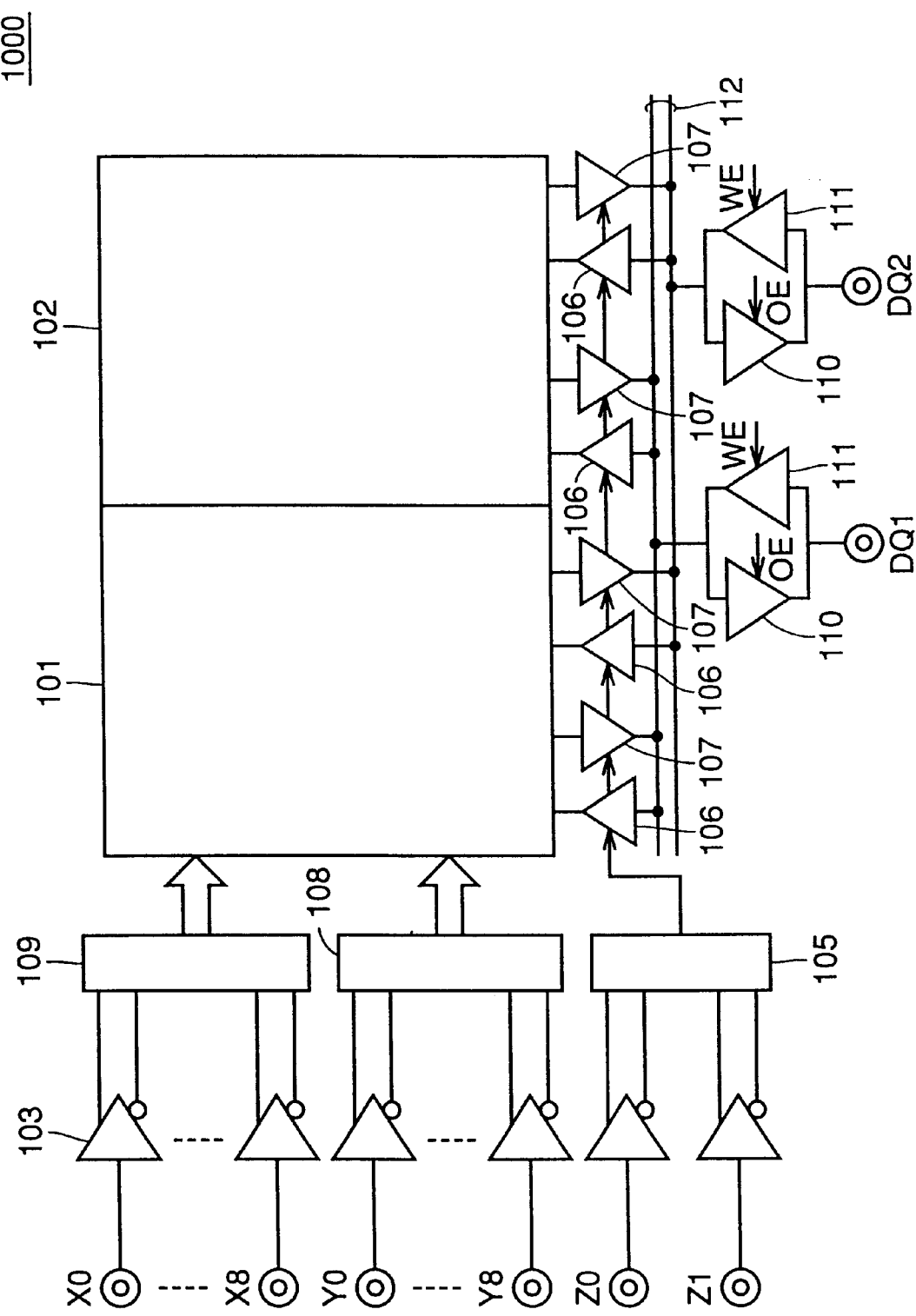
FIG. 1 is a schematic block diagram showing a structure of a static semiconductor memory device 1000 according to a first embodiment of the present invention.

FIG. 1 is a schematic block diagram showing a structure of a static semiconductor memory device 1000 according to the first embodiment of the present invention.

FIG. 1 shows an SRAM having a word of 2 bits for simplicity of description. Namely, in the SRAM, data input/output is performed by two data input/output terminals DQ1 and DQ2, and the SRAM has two separate data I/Os.

Referring to FIG. 1, SRAM 1000 includes: memory blocks 101 and 102; an address buffer 103 receiving an external address signal for outputting a complementary internal address signal; a block selector circuit 105 for selecting a memory block to be accessed in accordance with address signals Z0 and Z1; a row decoder 109 for selecting a memory cell row (a word line) to be accessed in accordance with address signals X0 to X8 in the selected memory block; a column decoder 108 for selecting a memory cell column (a pair of bit lines) to be accessed in accordance with address signals Y0 to Y8 in the selected memory block; a writing driver 106 for writing data to the selected memory cell; a sense amplifier 107 for reading data; a data output buffer 110 for outputting read data to data input/output terminal DQ1 or DQ2; a data input buffer 111 for inputting written data applied to data input/output terminal DQ1 or DQ2; and a data bus 112 for data transfer between data output buffer 110 and sense amplifier 107 as well as between data input buffer 111 and writing driver 106. Data input buffer 111 includes an input protection circuit and converts a level of an externally applied input signal to an internal logic level.

Figure 2:
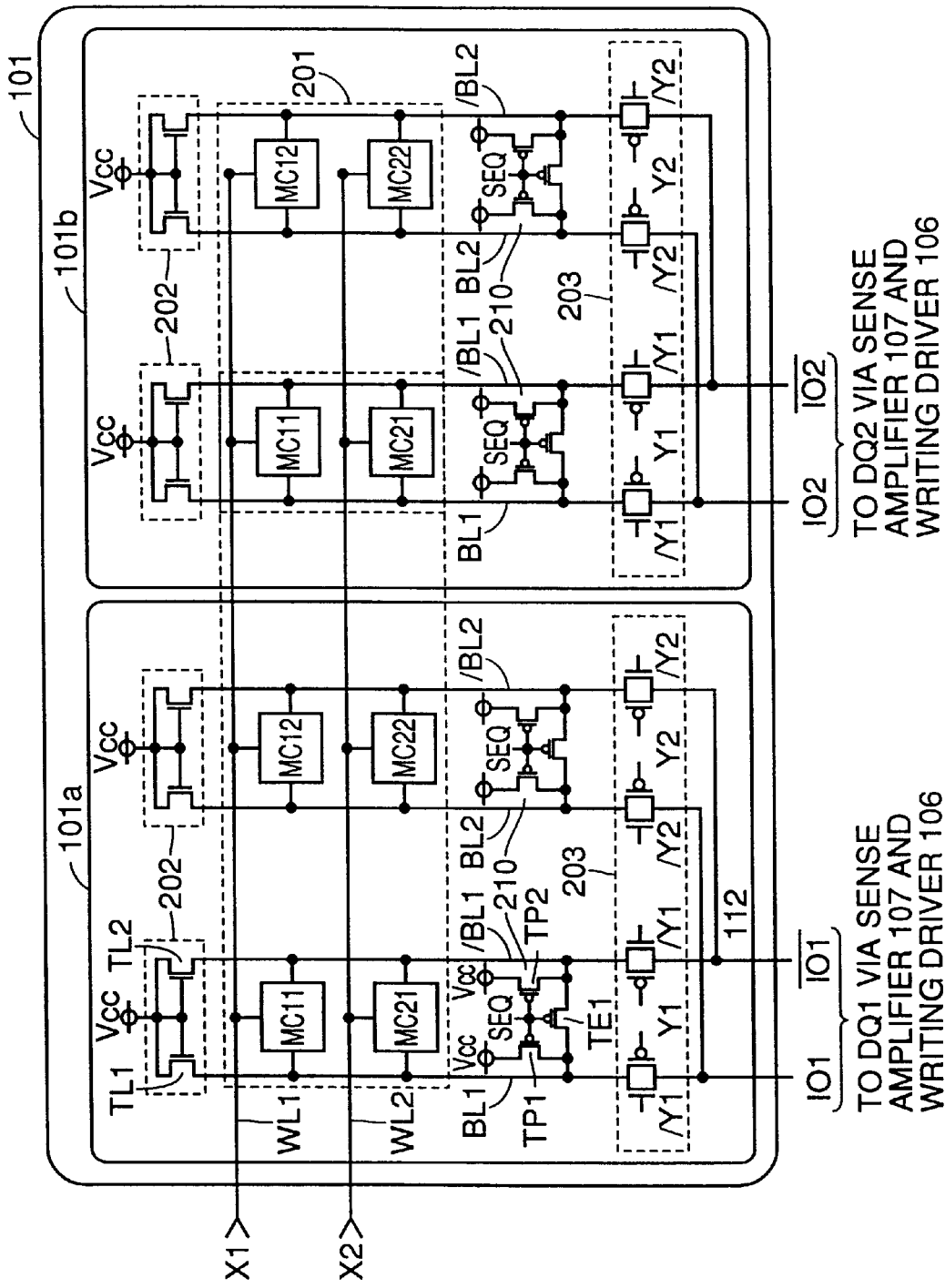
FIG. 2 is a block diagram showing in further detail a structure of a memory block 100 shown in FIG. 1.

FIG. 2 is a block diagram showing in further detail a structure of memory block 101 shown in FIG. 1. Memory block 102 has a structure similar to that of memory block 101.

Referring to FIG. 2, memory block 101 is provided with a memory cell array 201 having memory cells arranged in a matrix.

Memory block 101 further includes a sub block 101a corresponding to data input/output terminal DQ1, and a sub block 101b corresponding to data input/output terminal DQ2.

Each of sub blocks 101a and 101b includes: a bit line load circuit 202 arranged for every pair of bit lines; and a multiplexer 203 selectively connecting writing driver 106 or sense amplifier 107 to a memory cell column (a pair of bit lines) controlled and selected by internal column address signals Y1, /Y1, Y2 and /Y2 output from column decoder 108. It is noted that writing driver 106 and sense amplifier 107 which are provided for every memory cell column are not shown in FIG. 2.

Bit line load circuit 202 is provided for supplying a current to a corresponding pair of bit lines from a power supply source other than the memory cell power supply source. Bit line load circuit 202 includes bit line load transistors TL1 and TL2 each diode-connected.

Memory block 101 further includes a precharge power supply source 210 supplying a potential from a power supply source other than the memory cell power supply source for precharging the pair of bit lines to the "H" level.

Precharge power supply source 210 includes: P channel MOS transistors TP1 and TP2 controlled by a signal SEQ for supplying a potential from the power supply source other than the memory cell power supply source to the pair of bit lines; and a P channel MOS transistor TE1 controlled by signal SEQ for equalizing the potential of the pair of bit lines.

Figure 3:
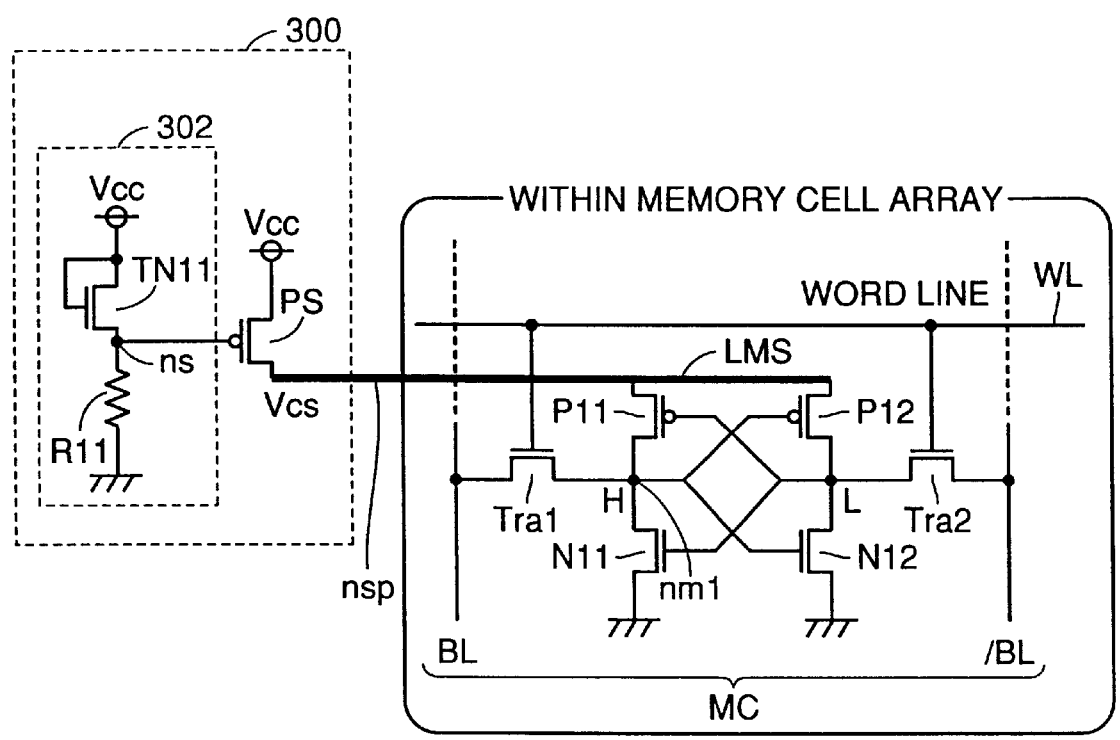
FIG. 3 is a circuit diagram showing structures of a memory cell and a memory cell power supply circuit 300 in static semiconductor memory device 1000 of the present invention shown in FIG. 2.

FIG. 3 is a circuit diagram showing structures of a memory cell and a memory cell power supply circuit 300 in static semiconductor memory device 1000 of the present invention shown in FIG. 2.

Figure 16:
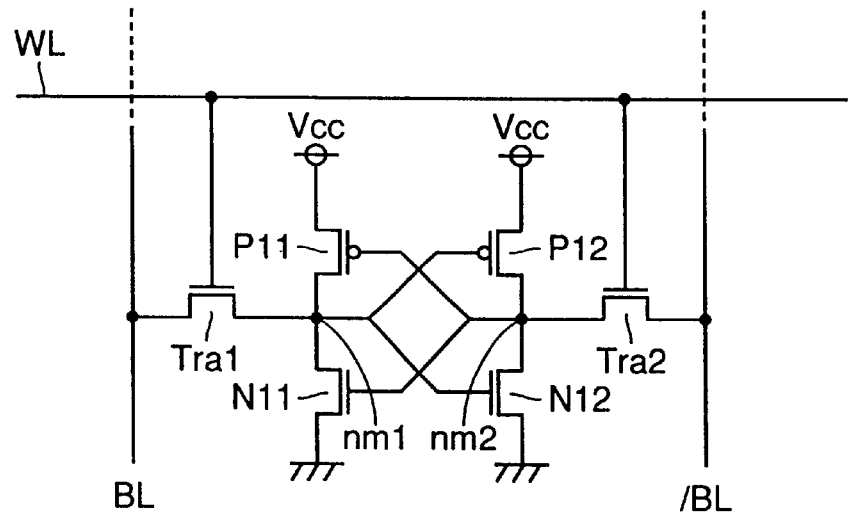
FIG. 16 is a circuit diagram showing a structure of memory cells in a static random access memory including a conventional MOS transistors.
Figure 17:
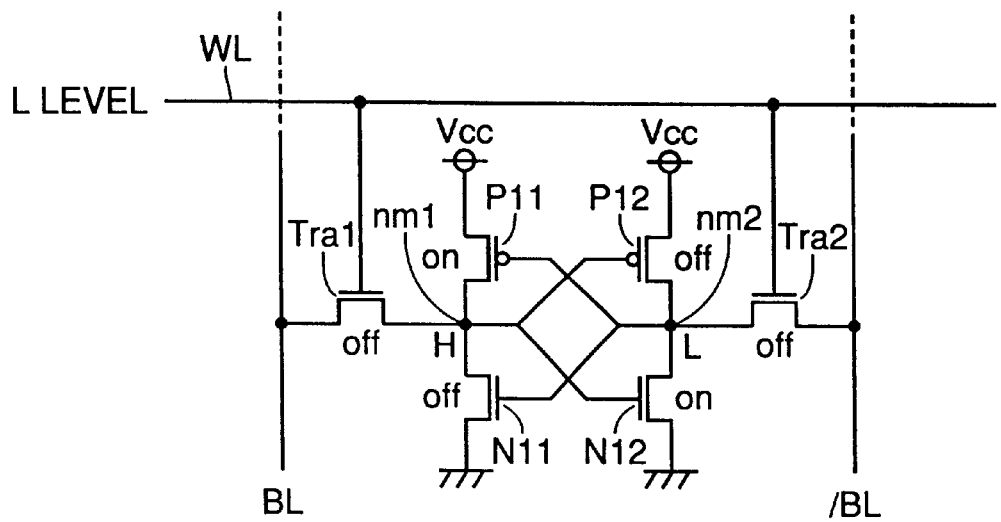
FIG. 17 is a diagram shown conjunction with a current flowing through all memory cells in a stand-by mode or to a memory cell in a non-selected row during reading and writing operations.
Figure 18:
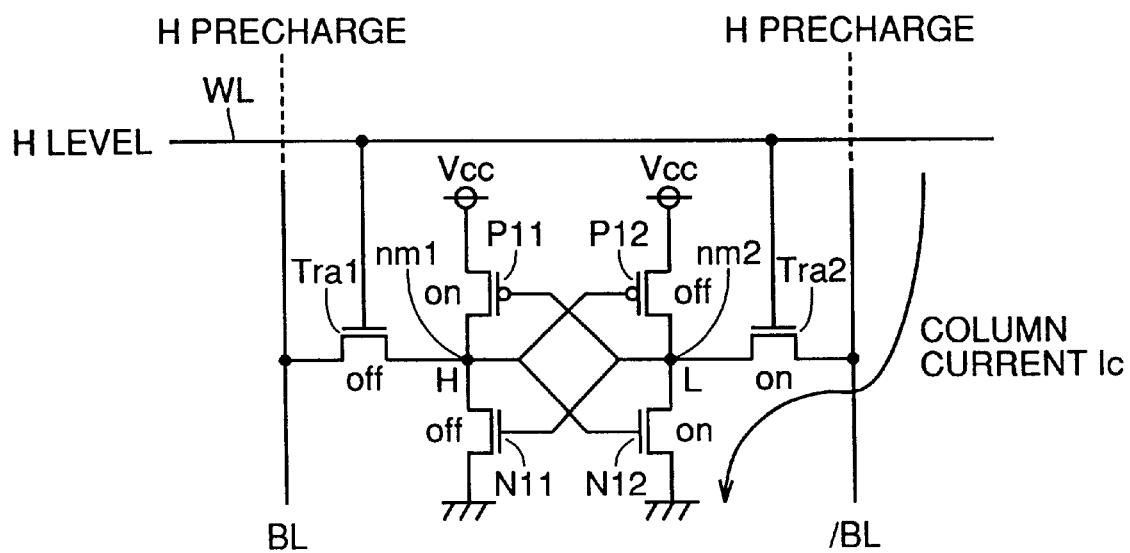
FIG. 18 is a diagram shown in conjunction with a current flowing through a memory cell in a selected row during the reading operation and in a selected row and in a non-selected column during the writing operation.
Figure 19:
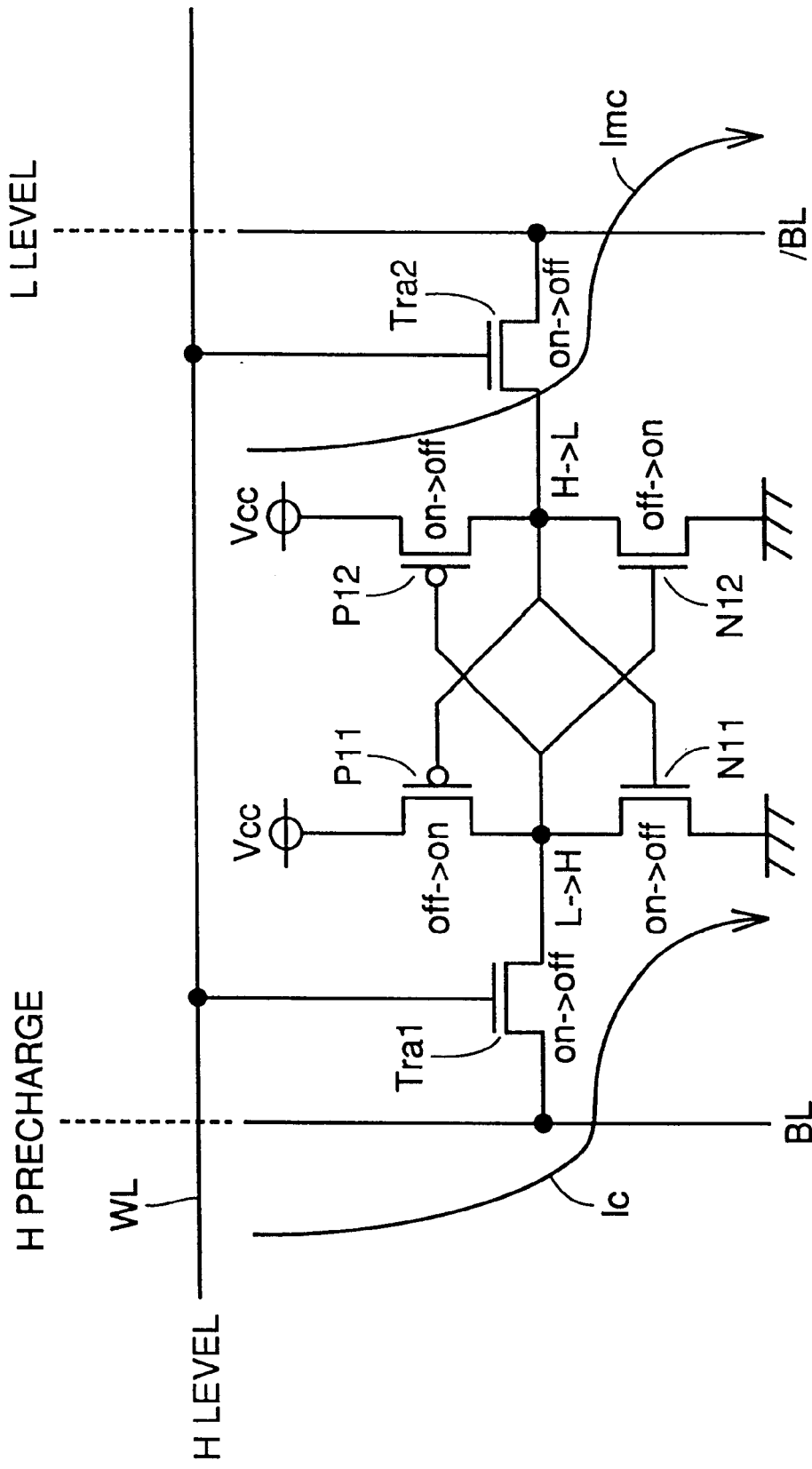
FIG. 19 is a diagram shown in conjunction with a current flowing through a memory cell to be rewritten in the selected row and in the selected column during the writing operation.

As a structure of memory cell MC is the same as that of the conventional memory cell shown in FIG. 16, the corresponding portions are denoted by the same reference numerals and description thereof will not be repeated.

To solve the problem with the conventional device, a circuit with an expanded operating voltage range is required. In such a circuit, memory cell power supply potential Vcs supplied to a load transistor of the memory cell is hardly down-converted from power supply voltage Vcc during a reading operation or in a stand-by mode, but memory cell power supply potential Vcs is down-converted from power supply voltage Vcc during a writing operation with high power supply voltage Vcc.

Here, an externally supplied voltage level or an output from an internal power supply circuit (not shown) converting an external power supply level to an internal power supply level is used as power supply voltage Vcc. In any case, memory cell power supply source 300 and a power supply for supplying a power supply potential to bit line load circuit 202 and precharge circuit 203 are separate.

Memory cell power supply circuit 300 has a function of increasing an amount by which potential Vcs is down-converted from power supply potential Vcc during the writing operation and reducing an amount by which potential Vcs is down-converted from power supply potential Vcc during the reading operation by applying a difference between currents flowing from memory cell power supply source 300 to the memory cell during the reading operation or in a stand-by mode, as well as during the writing operation.

P channel MOS load transistors P11 and P12 of transistors forming memory cell MC receive a power supply potential from potential supply node nsp of memory cell power supply circuit 310 through a cell power supply line LMS.

Memory cell power supply circuit 300 includes a memory cell power supply PMOS transistor Ps connected between power supply node nsp and power supply potential Vcc, and a gate potential control circuit 302 for controlling a gate potential of transistor Ps.

Gate potential control circuit 302 includes an N channel MOS transistor TN11 connected between power supply potential Vcc and a gate of transistor Ps, and a resistor R11 connected between the gate of transistor Ps and ground potential GND.

Transistor TN11 is diode-connected, and a connection node ns between transistor TN11 and resistor R11 is connected to the gate of transistor Ps. Here, a plurality of transistors similar to transistor TN11 may be connected in series between power supply potential Vcc and node ns.

Figure 4:
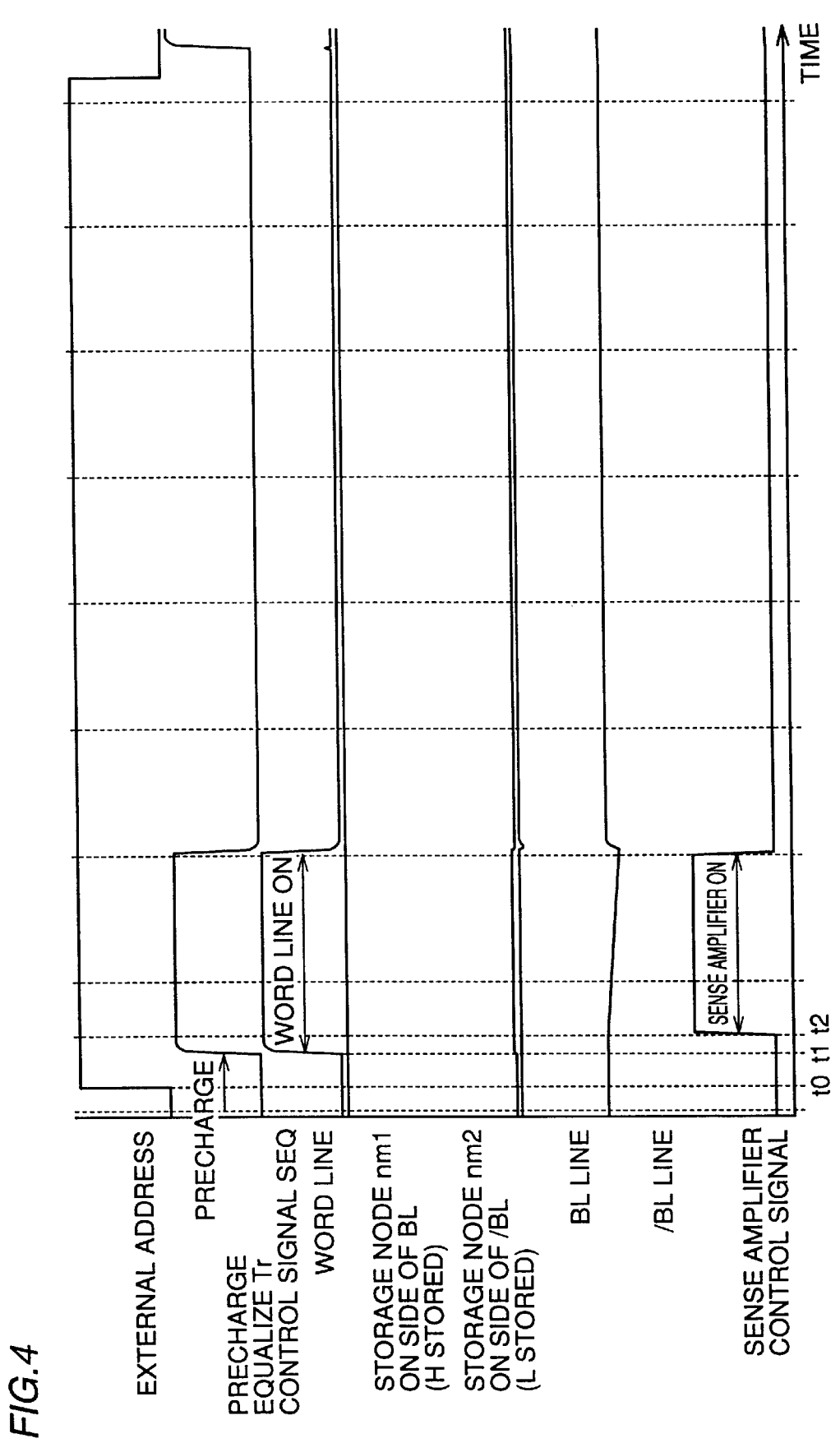
FIG. 4 is a timing chart shown in conjunction with an operation of reading from the memory cell in SRAM 1000 shown in FIG. 1.

FIG. 4 is a timing chart shown in conjunction with an operation of reading from a memory cell of SRAM 1000 shown in FIG. 1.

In the memory cell shown in FIG. 3, data is stored by a latch including transistors P11, Ni1, P12 and N12.

Referring to FIG. 4, when an external address is applied at a time t0, first, at a time t1, the bit line is precharged to the "H" level by precharge transistors TP1 and TP2. Further, an address signal is decoded by a row decoder 109, and a word line WL to be accessed is activated.

For the memory cells in the selected row, access transistors Tra1 and Tra2 are brought into the conductive state and a column current is supplied to the bit line.

Thus, a potential of bit line /BL on the side where a potential of a storage node is at the "L" level decreases.

At a time t2, a selection signal is input to multiplexer 203 from a column decoder 108 in accordance with a column address signal, and a pair of bit lines in the column to be accessed are activated. At the same time, a sense amplifier control signal is activated and a potential difference between the bit lines BL and /BL is amplified by sense amplifier 107.

A block address signal for designating a memory block to be accessed is applied to a block selector circuit 105, and the block address signal is decoded to generate a block selection signal. A sense amplifier control signal, which has been selectively activated in accordance with the block selection signal, is input to sense amplifier 107, and data only in the selected block is input to a data output buffer 110 by data bus 112.

Data is output from data output buffer 110 when an output enable signal OE is at the "H" level, whereas an input/output pad is in a high impedance state when signal OE is at the "L" level.

Figure 5:
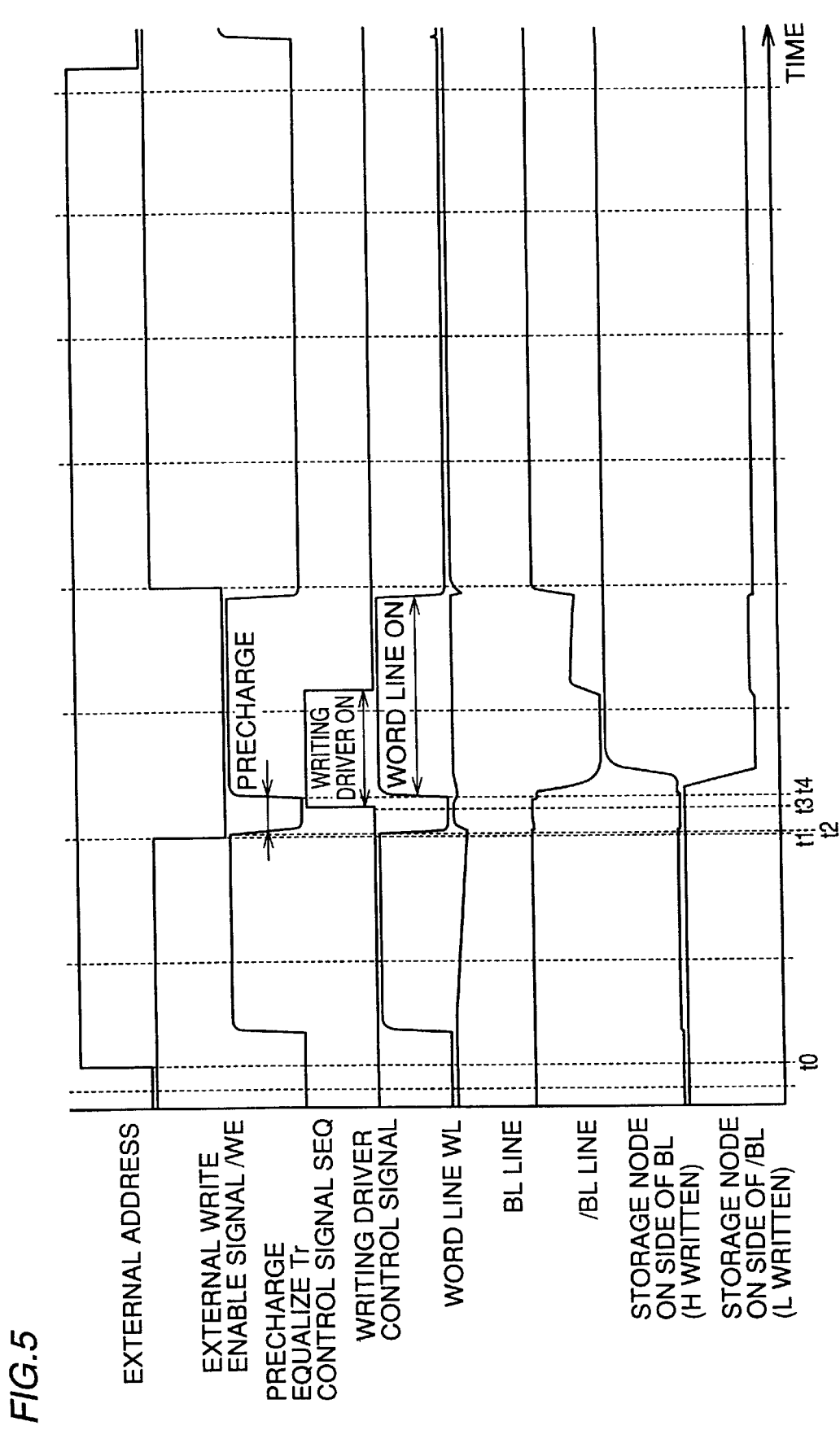
FIG. 5 is a timing chart shown in conjunction with an operation of writing to the memory cell of SRAM 1000 shown in FIG. 1.

FIG. 5 is a timing chart shown in conjunction with an operation of writing to the memory cell of SRAM 1000. time t0, an external address is applied to SRAM 1000.

The external data input to input/output pads DQ1 and DQ2 are converted to attain to an internal data level by data input buffer 111.

At t1, data is output to data bus 112 when write enable signal /WE attains to the "L" level in data input buffer 111.

At a time t3, a writing driver control signal which is selectively activated in accordance with a block selection signal generated by block selector circuit 105 is input to writing driver 106, and writing driver 106 only in the selected block is activated.

Two bit lines BL and /BL are precharged to the "H" level by precharge transistors TP1 and TP2 between times 2 and 4.

At 4, the memory cell column is selected by a multiplexer 203 in accordance with a selection signal from column decoder 108. Then, the level of one bit line /BL is decreased to the "L" level by the writing buffer, so that the data are written to the pair of bit lines BL and /BL. On the other hand, only one word line WL is activated by the row decoder and access transistors Tra1 and Tra2 are brought into the conductive state, so that data is written to a single memory cell.

Figure 6:
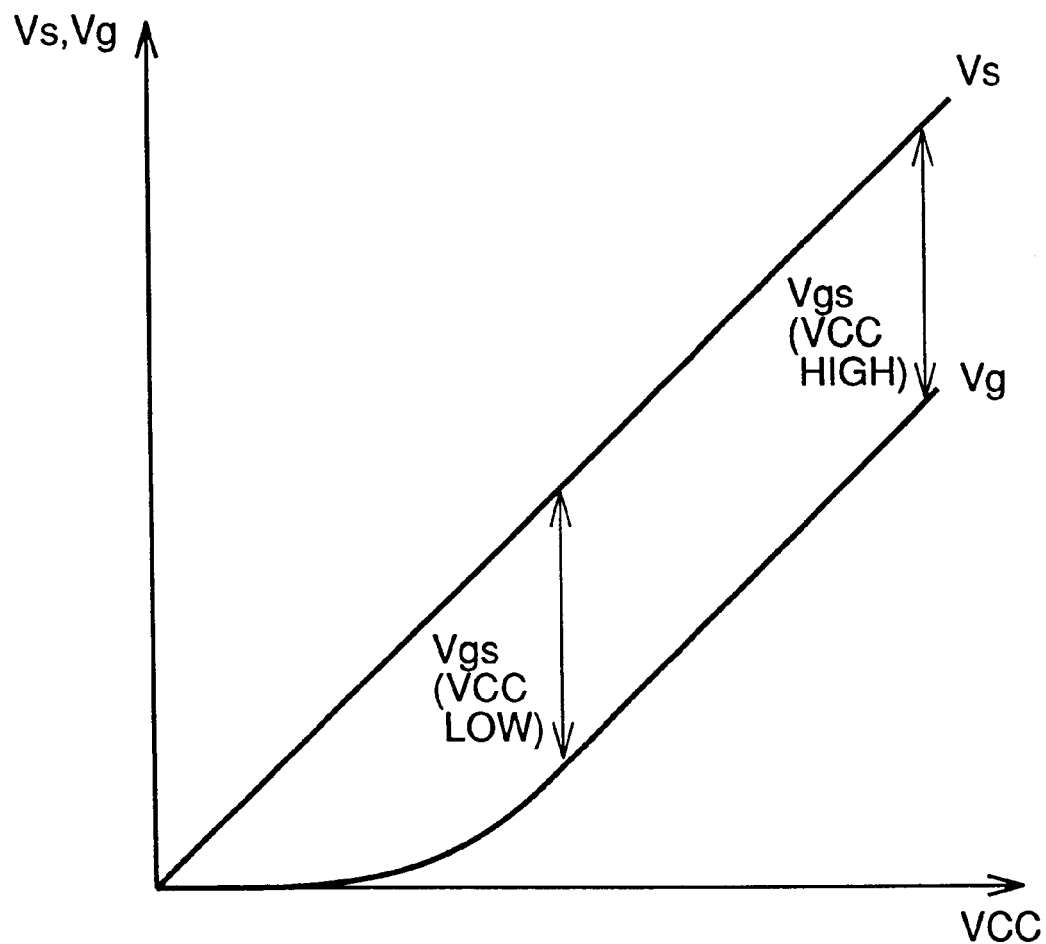
FIG. 6 is a diagram showing a relationship between a potential which is input to a source and gate of a memory cell power supply PMOS transistor Ps shown in FIG. 3 and a power supply voltage Vcc.

FIG. 6 is a diagram showing a relationship between a potential which is input to a source and gate of memory cell power supply PMOS transistor Ps shown in FIG. 3 and a power supply voltage Vcc.

As is apparent from FIG. 6, a gate-source voltage Vgs of memory cell power supply PMOS transistor Ps is at a prescribed level regardless of memory cell power supply voltage Vcc.

Figure 7:
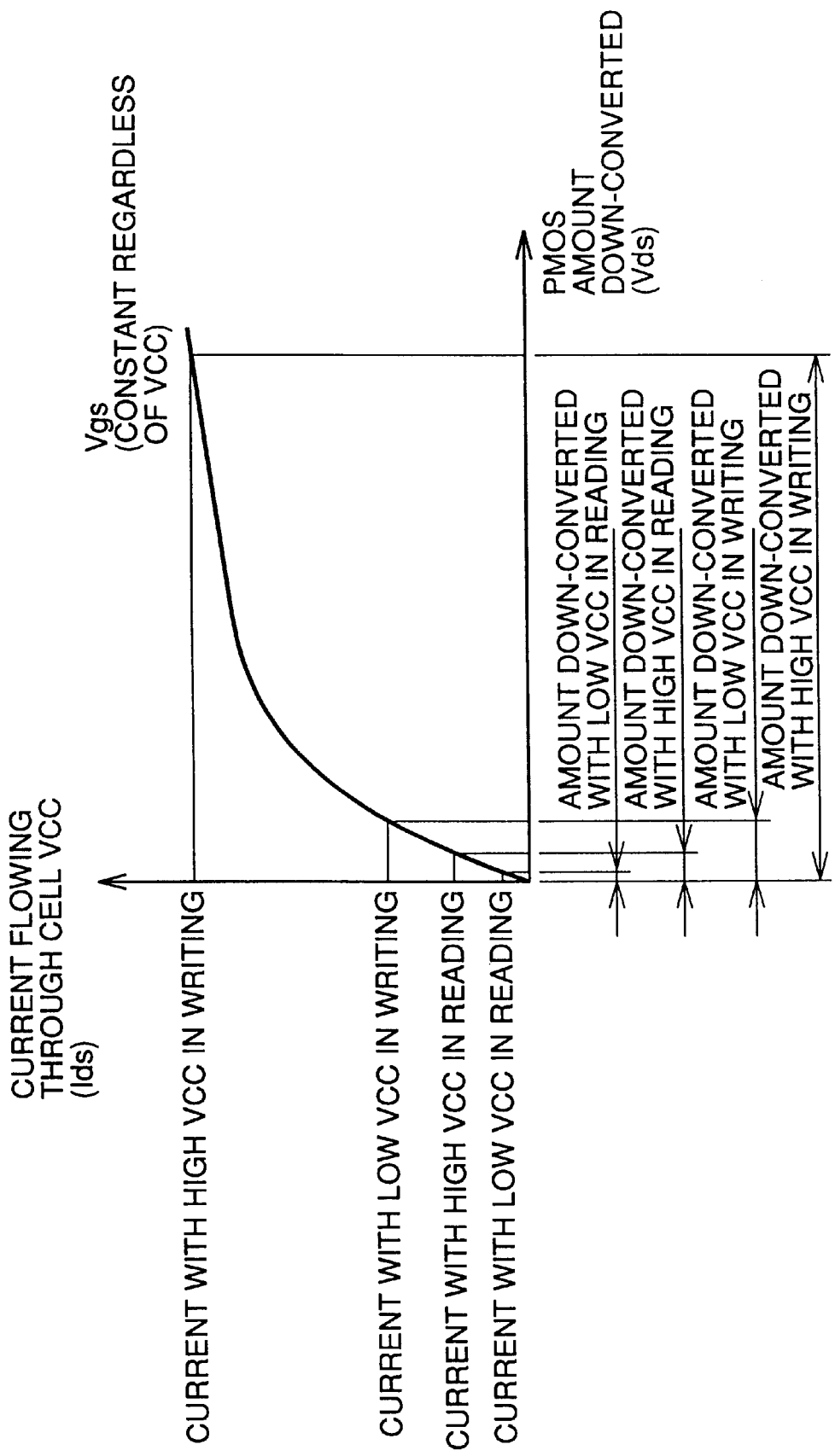
FIG. 7 is a diagram showing voltage and current properties of the memory cell power supply PMOS transistor shown in FIG. 3.

FIG. 7 is a diagram showing voltage and current properties of the memory cell power supply PMOS transistor shown in FIG. 3.

Referring to FIG. 7, during the writing operation when a current supplied from the memory cell power supply source is large, an amount by which a voltage of memory cell power supply PMOS transistor Ps is down-converted is greater than during the reading operation when a current supplied from the memory cell power supply source is small.

Figure 20:
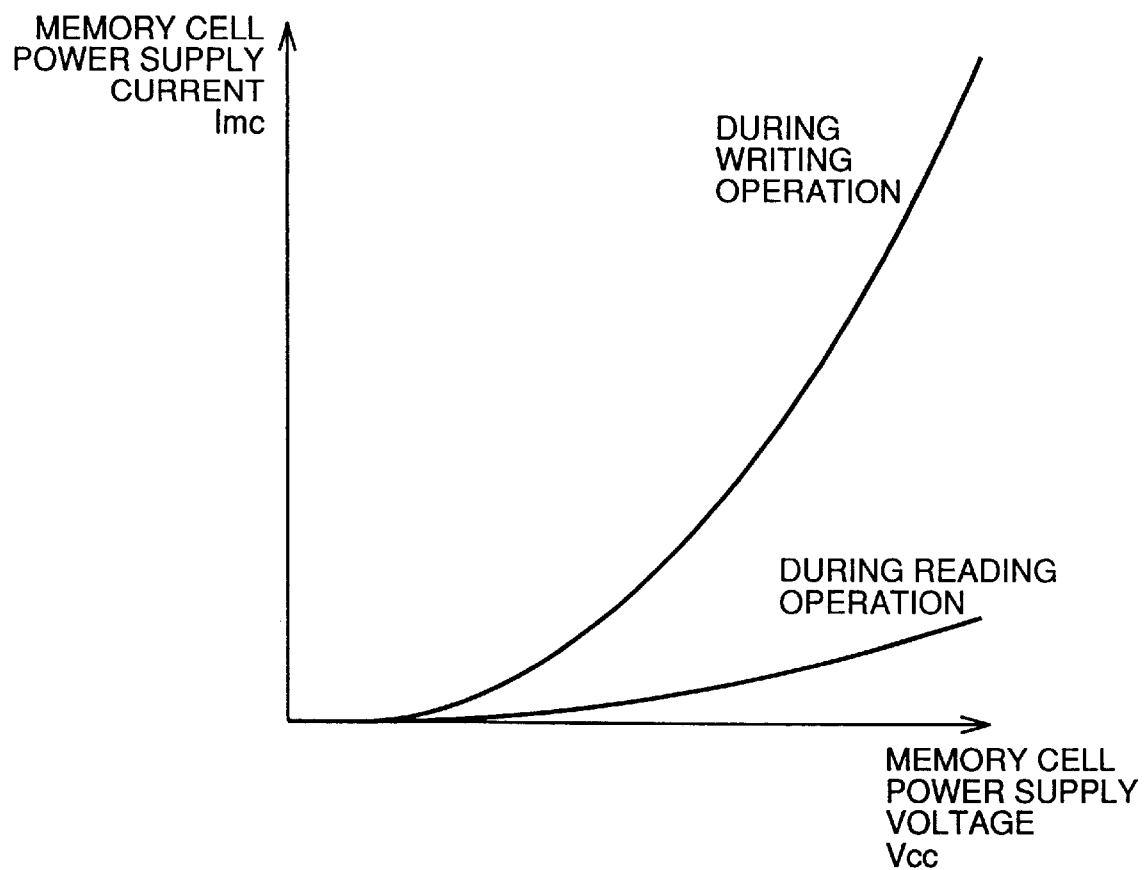
FIG. 20 is a diagram showing a relationship between a current flowing through the memory cell from the memory cell power supply during reading and writing operations and the memory cell power supply voltage.
Figure 21:
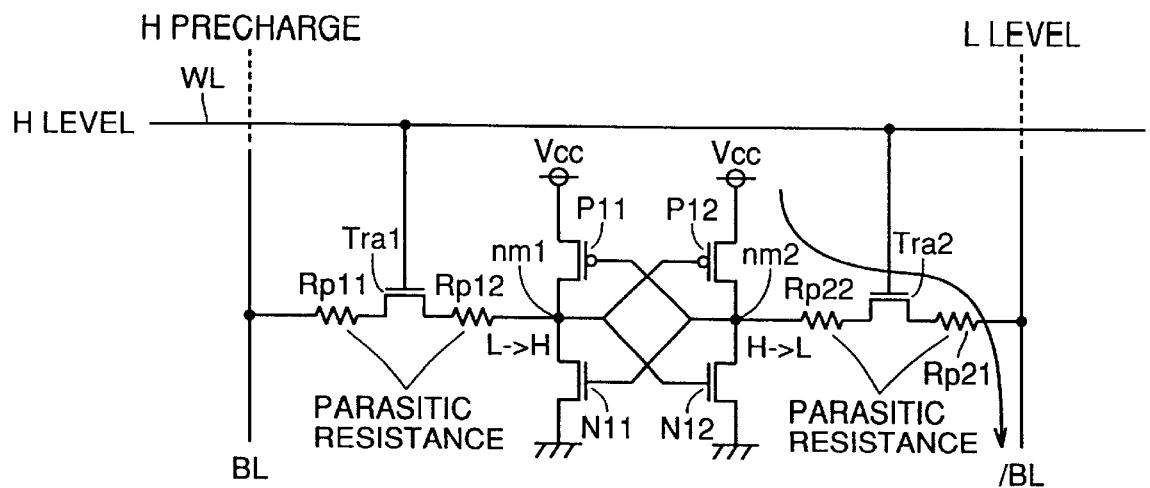
FIG. 21 is a schematic diagram shown in conjunction with a case where an upper limit of a power supply voltage enabling operation of the memory cell is restricted by the presence of a parasitic resistance during the writing operation.
Figure 22:
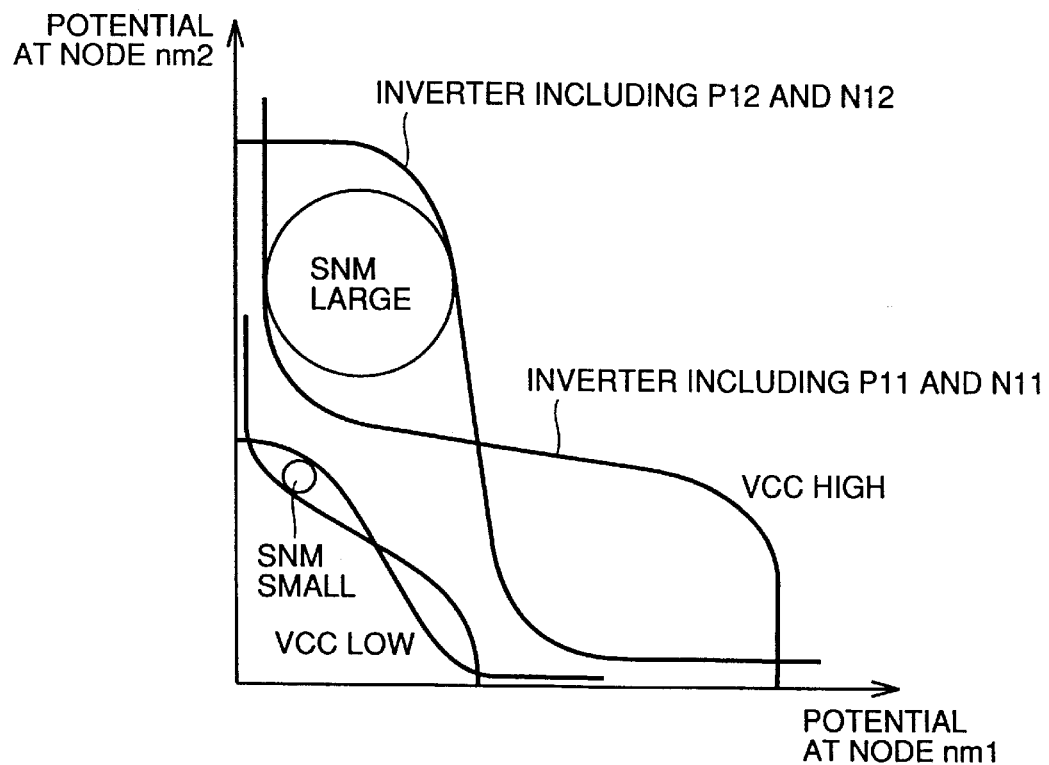
FIG. 22 is a diagram shown in conjunction with a case where a lower limit of the operating voltage of the device is restricted when memory cell power supply voltage Vcc is low during the reading operation.

Further, for the writing operation with the same condition, a power supply current supplied to the memory cell depends on the memory cell power supply voltage as shown in FIG. 20. Accordingly, in the case where power supply voltage Vcc is relatively high when a larger current must be supplied to the memory cell, an amount by which memory cell power supply potential Vcs is down-converted from power supply voltage Vcc is smaller than in the case where power supply voltage Vcc is low when a current flowing to the memory cell is small.

For the reading operation, the amount by which the voltage is down-converted also depends on power supply voltage Vcc.

Figure 8:
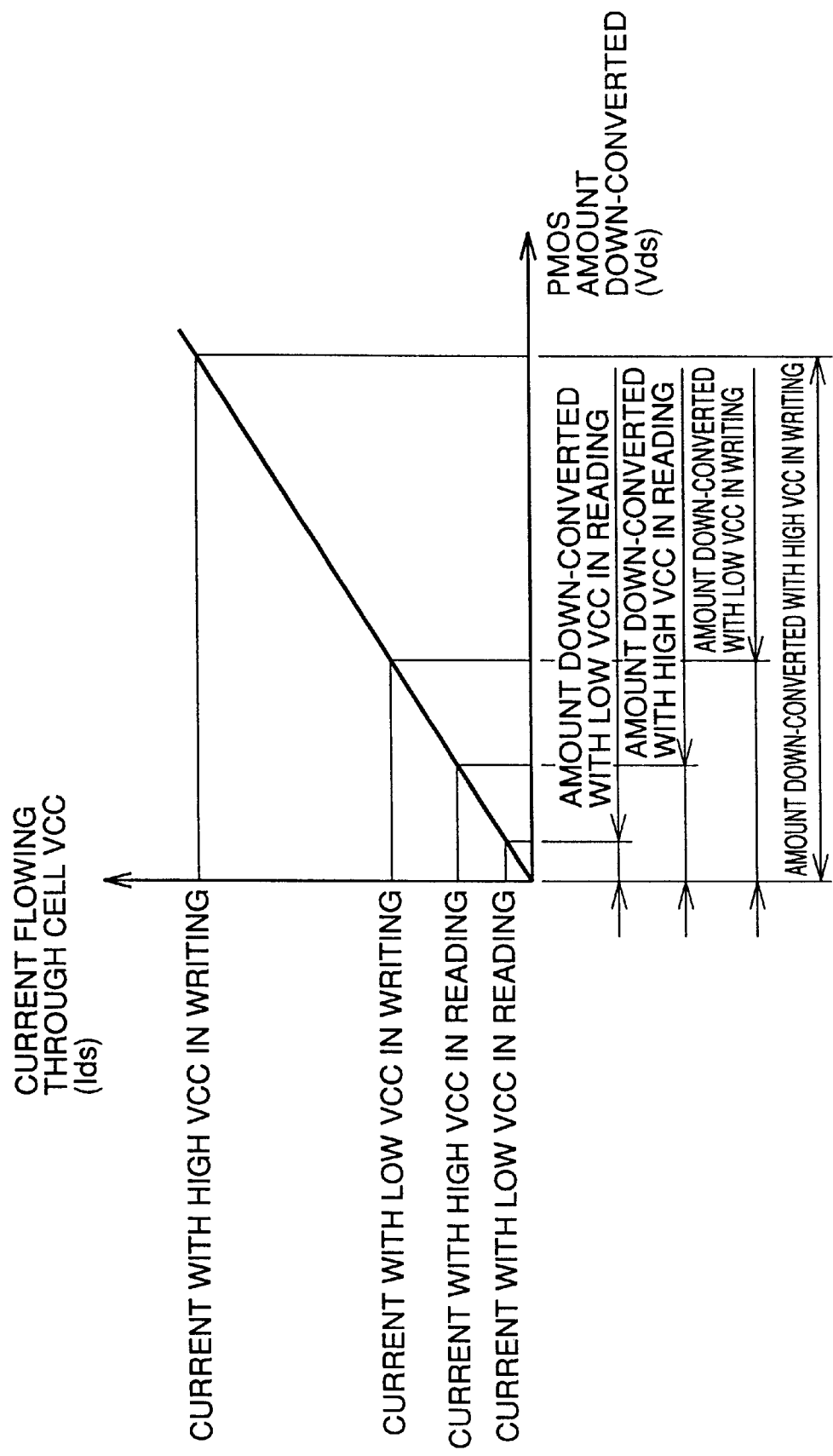
FIG. 8 is a diagram showing a voltage across both ends of a resistor when the voltage is down-converted by the resistor and a current flowing through the resistor.

FIG. 8 is a diagram showing a voltage across both ends of a resistor when a voltage is down-converted and a current flowing through the resistor when the resistor is simply provided in place of P channel MOS transistor Ps.

As shown in FIG. 7, when a voltage is down-converted by P channel MOS transistor Ps, unlike a simple resistor, a current difference is amplified and a difference in amount by which a voltage is down-converted can be increased in accordance with power supply voltage Vcc because of voltage and current properties specific to a MOS transistor.

In other words, a voltage is down-converted by a greater amount in the case of a large current, whereas a voltage is down-converted by a smaller amount in the case of a small current. Thus, a voltage is down-converted by a great amount only during the writing operation in the case of high power supply voltage Vcc when the voltage must be reduced by a greater amount. On the other hand, a voltage can be down-converted by a smaller amount during the reading operation or in the stand-by mode when the voltage needs not be down-converted and during the writing operation in the case of low power supply voltage Vcc.

The present invention is different from Japanese Patent Laying-Open No. 4-132080 in the following respect. More specifically, in the present invention, a range of an operating voltage can be expanded by facilitating the writing operation of full CMOS memory cells including only MOS transistors. On the other hand, in the circuit disclosed in the aforementioned application, a stand-by current of the high-resistance load memory cell is reduced.

In view of the aforementioned difference in object and effect, the memory cells and cell power supply circuit having the above mentioned structure and the memory cells and cell power supply circuit 300 of the present invention have the following distinguishable features.

The difference mainly relates to the size of the memory cell power supply PMOS transistor.

More specifically, in the circuit structure shown in FIG. 5 of the aforementioned laid open application, IDSS of the memory cell power supply PMOS transistor is directly used as an upper limit of a stand-by current of the memory cell array to which the memory cell power supply PMOS is connected, as described above. In the present invention, when source-drain voltage Vds of the memory cell power supply PMOS transistor Ps equals to memory cell power supply voltage Vcc minus a voltage enabling the writing operation, memory cell power supply PMOS transistor Ps is sized such that a current required for a writing operation to a single memory cell flows therethrough.

Such a current is large as compared with the stand-by current of the memory cell array as described below. Therefore, in the present invention, the size of memory cell power supply PMOS transistor Ps must be greater than that disclosed in the aforementioned laid open application.

In other words, in the full CMOS memory cell of the present invention, a driving force of a load PMOS is too strong. To ensure that data is written to the memory cell, in the writing operation with high power supply voltage Vcc, the size of the memory cell power supply PMOS transistor is determined as follows.

Assume that an upper limit allowing writing operation is Vwrite, and a current flowing through one memory cell load PMOS transistor is Iwrite. Then, a bias condition for memory cell power supply PMOS transistor Ps can be expressed as follows.

$$Vds=Vcc-Vwrite$$

$$Vgs=Vg-Vs=-N\times Vth$$

Here, Vth is a threshold value voltage of transistor TN11, and N is the number (where N=1 in FIG. 3) of transistors TN11 provided in series between node ns and power supply potential Vcc.

Then, the size of the memory cell power supply PMOS transistor is determined such that a current flowing therethrough Ids equals to Iwrite. Alternatively, the size of the memory cell power supply PMOS transistor is determined such that a current flowing therethrough is at most Iwrite.

With the above described structure, a range of an operating voltage of the device can be expanded by increasing an upper limit of the operating voltage of the device which is restricted by the writing operation of the memory cell while ensuring a lower limit of the operating voltage of the device which is restricted by the reading operation of the memory cell.

Second Embodiment

Figure 9:
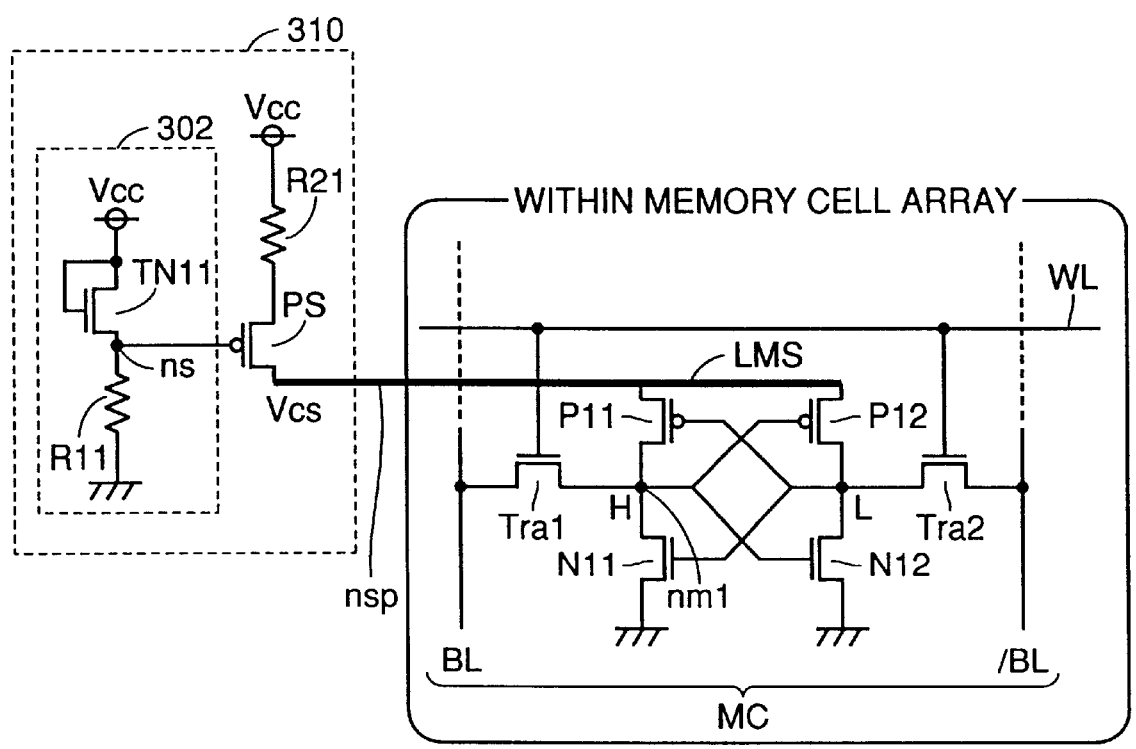
FIG. 9 is a circuit diagram showing structures of a memory cell of an SRAM and memory cell power supply circuit 310 according to a second embodiment of the present invention.

FIG. 9 is a circuit diagram showing structures of a memory cell and a memory cell power supply circuit 310 of an SRAM according to the second embodiment of the present invention.

Referring to FIG. 9, P channel MOS load transistors P11 and P12 of transistors forming a memory cell MC are supplied with a power supply potential from a potential supply node nsp of memory cell power supply circuit 310 by a cell power supply line LMS.

Memory cell power supply circuit 310 includes a resistor R21 and memory cell power supply PMOS transistor Ps connected in series between power supply node nsp and power supply potential Vcc, as well as a gate potential control circuit 302 for controlling a gate potential of transistor Ps.

Gate potential control circuit 302 includes an N channel MOS transistor TN11 arranged between power supply potential Vcc and a gate of transistor Ps, and a resistor R11 provided between a gate of transistor Ps and ground potential GND.

Transistor TN11 is diode-connected, and connection node ns between transistor TN11 and resistor 11 is connected to the gate of transistor Ps.

More specifically, memory cell power supply circuit 310 according to the second embodiment has resistor R21 between transistor Ps and power supply potential Vcc in addition to a structure of memory cell power supply circuit 300 of the first embodiment.

A gate-source voltage Vgs of memory cell power supply PMOS transistor Ps of the first embodiment is at a prescribed value, and voltage and current properties of transistor Ps are not changed.

Figure 10:
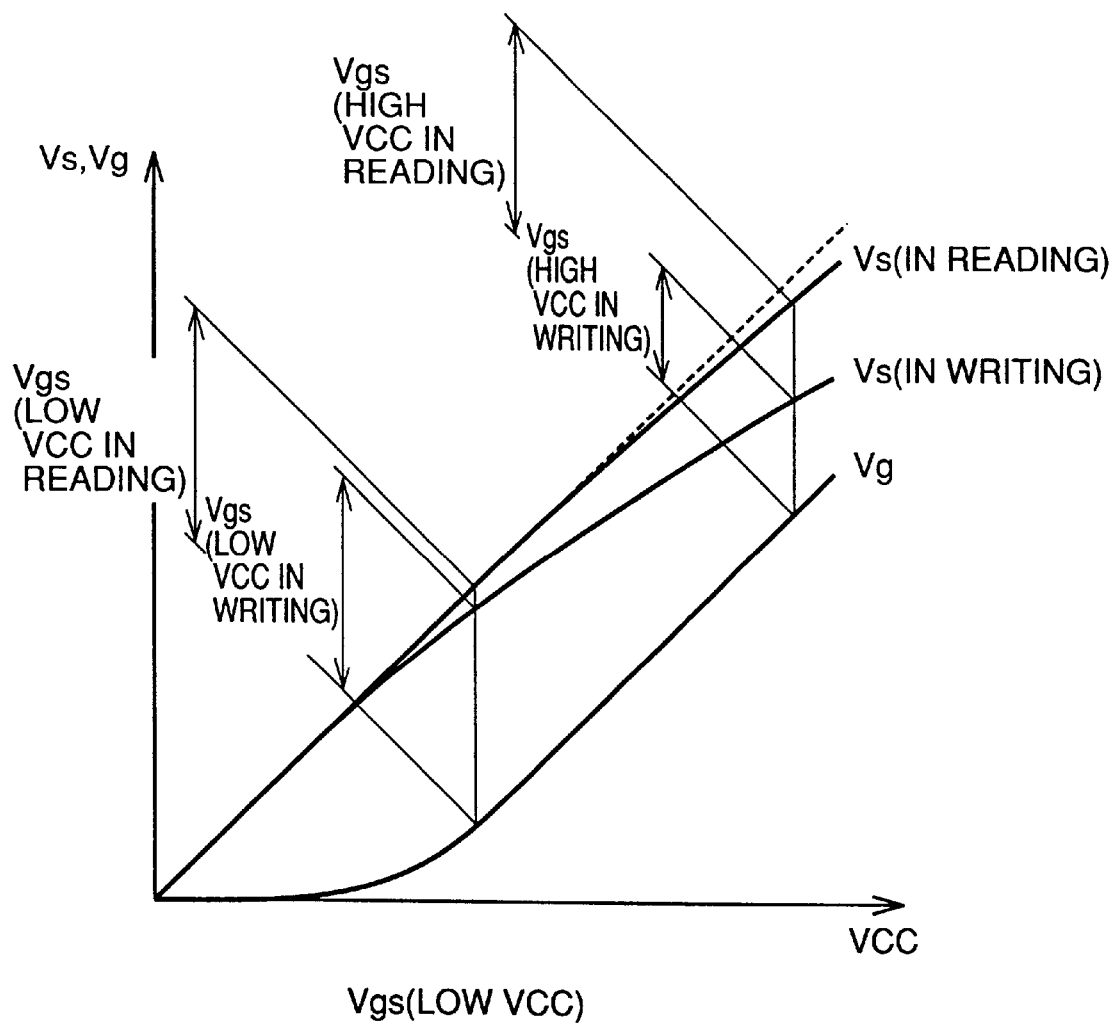
FIG. 10 is a diagram showing a relationship between a source potential Vs and gate potential Vg of memory cell power supply PMOS transistor Ps and power supply potential Vcc according to the second embodiment.

As shown in FIG. 10, however, in memory cell power supply circuit 310 of the second embodiment, resistor R21 is arranged between the source of transistor Ps and power supply potential Vcc, and a potential applied to the source of memory cell power supply PMOS transistor Ps is changed in accordance with the memory cell power supply current. As a result, the voltage and current properties of memory cell power supply PMOS transistor Ps are actively controlled, and a greater change in voltage which is down-converted in accordance with a current flowing through memory cell power supply circuit 310 can be achieved as compared with the case of memory cell power supply circuit 300 of the first embodiment.

As the memory cell power supply current depending on the memory cell power supply voltage as shown in FIG. 20 flows through memory cell power supply PMOS transistor Ps, the voltage is down-converted by a greater amount in proportion to the memory cell power supply current by resistor R21.

FIG. 10 is a diagram showing a relationship between a source potential Vs and a gate potential Vg of memory cell power supply PMOS transistor Ps of the second embodiment having the above described structure and power supply potential Vcc.

More specifically, when power supply potential Vcc is high and during the writing operation when a greater amount of current is supplied to the memory cell, due to the voltage down-conversion by resistor R21, a source potential at transistor Ps tends to be lower than the case of the first embodiment shown in FIG. 6.

Figure 11:
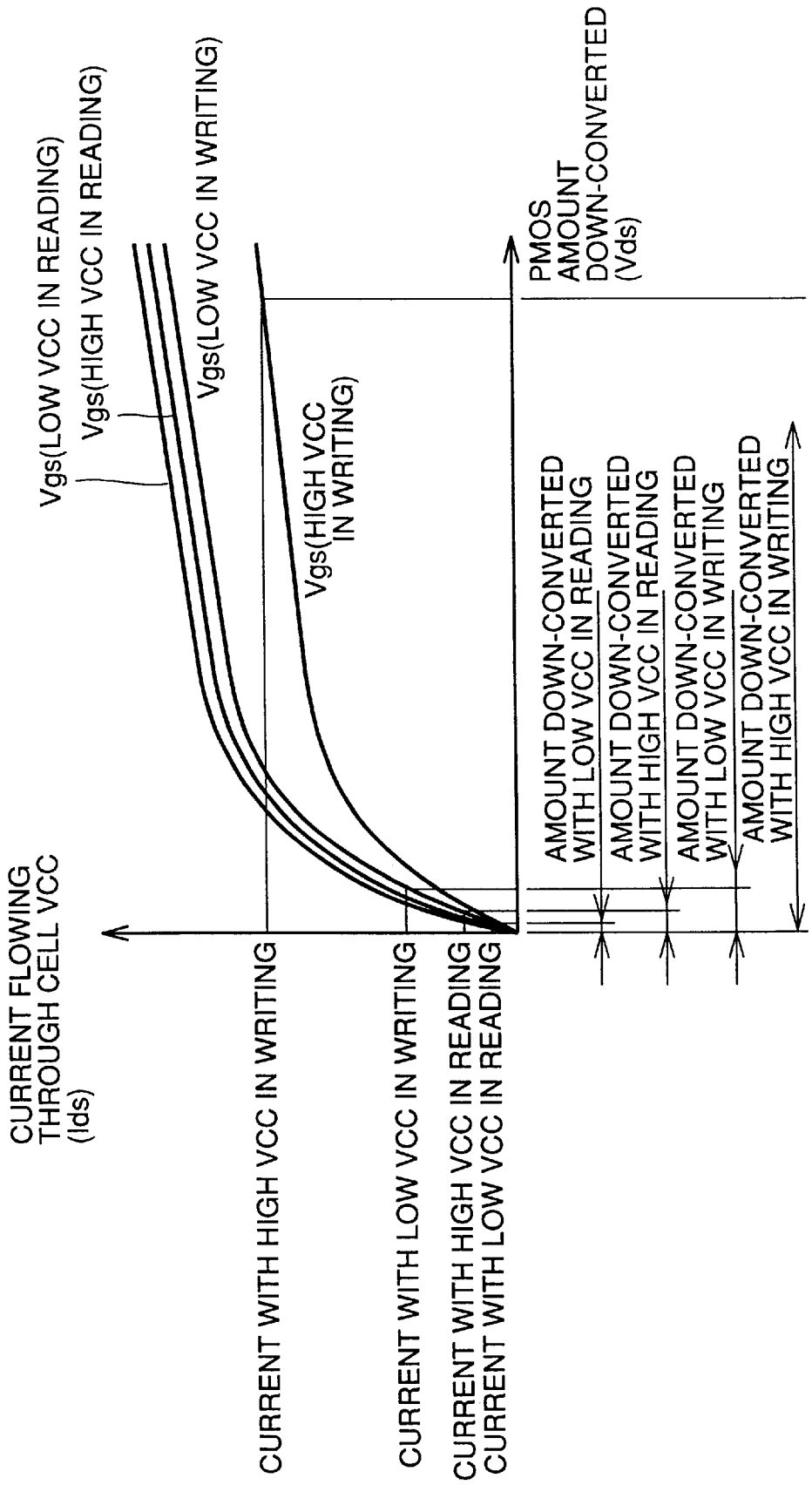
FIG. 11 is a diagram showing voltage and current properties of memory cell power supply PMOS transistor Ps when source potential Vs and gate potential Vg of transistor Ps are changed as shown in FIG. 10.

FIG. 11 is a diagram shown in conjunction with voltage and current properties of memory cell power supply PMOS transistor Ps when source potential Vs and gate potential Vg of transistor Ps are changed, being dependent on the power supply potential as shown in FIG. 10.

Referring to FIG. 11, in the case of high power supply potential Vcc and the writing operation when a value of current flowing through the memory cell increases, source potential Vs is down-converted by resistor R21 and a gate-source voltage Vgs decreases. Thus, current value Ids of transistor Ps is restricted in accordance with the voltage and current properties of memory cell power supply PMOS transistor Ps.

Accordingly, as compared with the case of memory cell power supply circuit 300 of the first embodiment shown in FIG. 7, even if the same current if supplied to the memory cell, power supply potential level Vcs supplied to the memory cell decreases by a greater amount from power supply potential Vcc.

On the other hand, during the reading operation when a current flowing through the memory cell is small or in the case of low power supply potential Vcc and the writing operation, a decrease in voltage by resistor R21 is large and source-gate potential Vgs is accordingly high. Thus, source-drain current value Ids increases in accordance with the voltage and current properties of memory cell power supply PMOS transistor Ps.

As a result, an amount by which power supply potential level Vcs supplied to the memory cell decreases from power supply potential Vcc is reduced.

With the above described structure, an upper limit of the voltage allowing a writing operation increases and data can be written to memory cell MC over a greater range of power supply potential Vcc, so that a range of the voltage enabling operation of the SRAM can be expanded.

Third Embodiment

Figure 12:
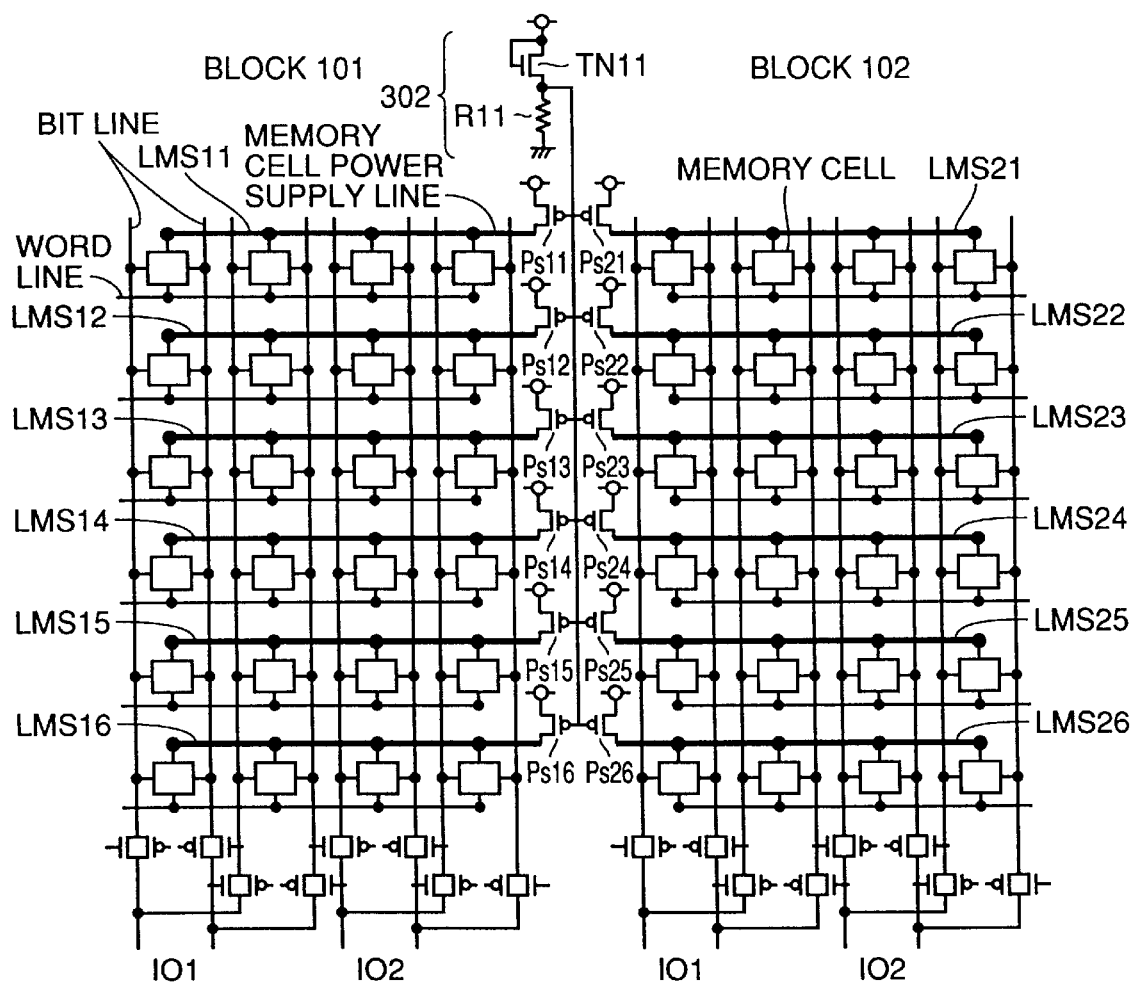
FIG. 12 is a schematic block diagram showing a structure for supplying memory cell power supply potential Vcs to a memory cell array having a plurality of memory cells arranged in an array.

FIG. 12 is a schematic block diagram showing a structure of supplying memory cell power supply potential Vcs to a memory cell array including a plurality of memory cells arranged in an array by the memory cell power supply circuit of the first embodiment shown in FIG. 3.

In FIG. 12, for simplicity of description, memory cell array 201 has a structure of six rows and eight columns, and each of memory blocks 101 and 102 includes memory cells in six rows and four columns.

In the structure shown in FIG. 12, cell power supply lines LMS11 to LMS 16 supplying power supply potential Vcs to the memory cells are arranged in memory block 101 in a row direction of the memory cell array. Cell power supply lines LMS21 to LMS26 supplying power supply potential Vcs to the memory cells are arranged in memory block 102 in the row direction of the memory cell array.

In this case, memory cell power supply PMOS transistors Ps11 to Ps26 are respectively arranged for cell power supply lines LMS11 to LMS26.

Gate potential control circuit 302 is shared by memory cell power supply PMOS transistors Ps11 to Ps26 and gate potentials of transistors Ps11 to Ps26 are controlled.

Thus, a parasitic capacitance or resistance of each of cell power supply lines LMS11 to 26 can be reduced, so that the memory cell power supply circuit operates in a more dependent manner with respect to power supply potential Vcc during the down-converting operation.

It is noted that, when the cell power supply lines are arranged in the column direction of the memory array, a memory cell power supply PMOS transistor may be arranged for every column.

Again, a parasitic capacitance or resistance of cell power supply line decreases, so that the memory cell power supply potential becomes more dependent during the voltage down-converting operation.

As in the first embodiment, of course, a range of a power supply potential enabling operation of the SRAM supplied with the power supply potential can be expanded.

Further, in the structure shown in FIG. 12, resistor R21 may be arranged between memory cell power supply PMOS transistor Ps and power supply potential Vcc as in the case of the memory cell power supply source of the second embodiment. This also applies to the case where the cell power supply line is arranged in the column direction.

Fourth Embodiment

Figure 13:
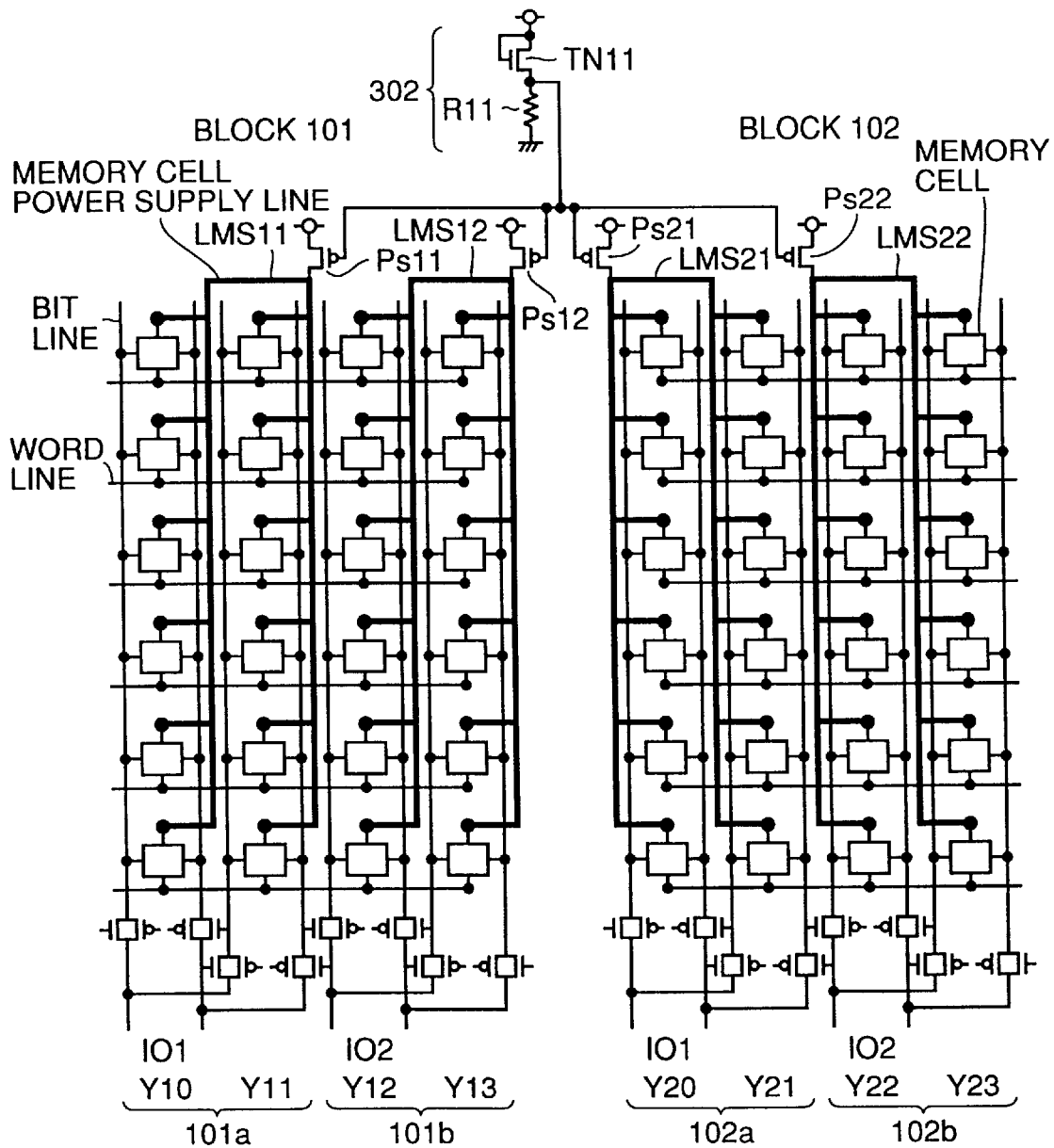
FIG. 13 is a schematic block diagram showing an arrangement of memory cell power supply PMOS transistors in an SRAM according to a fourth embodiment of the present invention.

FIG. 13 is a schematic block diagram showing an arrangement of a memory cell power supply PMOS transistor in an SRAM according to the fourth embodiment of the present invention.

Referring to FIG. 13, the memory cell power supply line extends in the column direction of a memory cell array. In memory block 101, a cell power supply line LMS11 is shared by memory cells in sub block 101a, and a cell power supply line LMS12 is shared by memory cells in sub block 101b.

Similarly, in memory block 102, a cell power supply line LMS21 is shared by memory cells in sub block 102a, and a cell power supply line LMS22 is shared by memory cells in sub block 102b.

As described with reference to FIG. 2, sub blocks 101a and 102a correspond to data input/output terminal DQ1, whereas sub block 101b and 102b correspond to data input/output terminal DQ2.

More specifically, in the structure shown in FIG. 13, in memory block 101, memory cell columns Y10 and Y11 in sub block 101a correspond to data input/output terminal DQ1, whereas memory cell columns Y12 and Y13 in sub block 101b correspond to data input/output terminal DQ2.

Similarly, in memory block 102, memory cell columns Y20 and Y21 in sub block 102a correspond to data input/ output terminal DQ1, whereas memory cell columns Y22 and Y23 in sub block 102b correspond to data input/output terminal DQ2.

In this case, memory cell power supply PMOS transistors Ps11 to Ps22 are respectively provided for cell power supply lines LMS11 to LMS22. In other words, each of memory cell power supply PMOS transistors Ps11 to Ps22 is arranged for a column corresponding to the same data input/output terminal in the same memory block.

Potential levels of gates of memory cell power supply PMOS transistors Ps11 to Ps22, each provided for the memory cell column corresponding to the same data input/ output terminal, are all controlled by a gate potential control circuit 302.

In the above described structure, the memory cell to be subjected to the writing operation during the writing operation of the memory cells which are actually connected to cell power supply lines LMS11 to LMS22 uniquely corresponds to one of memory cell power supply PMOS transistors Ps11 to Ps22.

On the other hand, unlike the structure shown in FIG. 13, when the memory cell power supply PMOS transistor is arranged for every row across the columns corresponding to different data input/output terminals, the number of memory cells to be subjected to the writing operation at a time may be one or the number of data input/output terminals, depending on data before and after the writing operation.

Thus, a current value that the memory cell power supply circuit should supply differs from the written data, so that instability may be caused to the supplied current value.

Then, as in the case of the SRAM according to the fourth embodiment shown in FIG. 13, memory cell power supply PMOS transistors Ps11 to Ps22 are arranged for the same data input/output terminals, i.e., the same I/O, so that a voltage-down-converting property of the memory cell power supply source can be more stabilized as compared with the case where they are arranged for every row.

It is noted that, for a stabilizing effect of the memory cell power supply as described above, a similar effect can be produced also in the case where memory cell power supply PMOS transistors Ps are arranged for every column in the third embodiment.

Further, also in the structure of the fourth embodiment, resistor R21 may be arranged between memory cell power supply PMOS transistor Ps and power supply potential Vcc as in the case of the memory cell power supply of the second embodiment.

Fifth Embodiment

Figure 14:
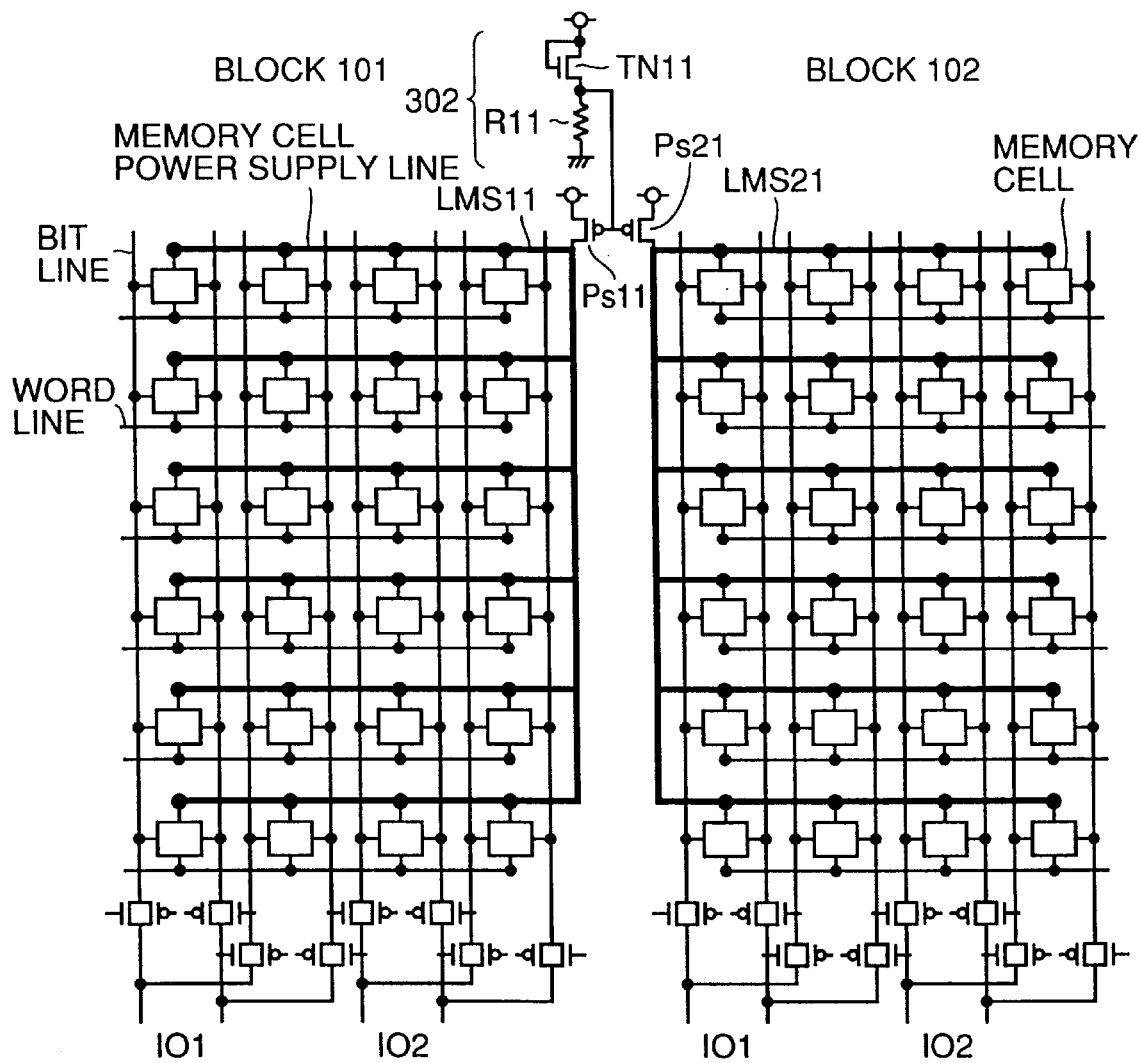
FIG. 14 is a schematic block diagram showing an arrangement of memory cell power supply PMOS transistors Ps1 1 to Ps2 1 in an SRAM according to a fifth embodiment of the present invention.

FIG. 14 is a schematic block diagram showing an arrangement of memory cell power supply PMOS transistors Ps11 to Ps21 in the SRAM according to the fifth embodiment of the present invention.

Referring to FIG. 14, in the SRAM of the fifth embodiment, cell power supply lines LMS11 and LMS21 are provided for respective memory blocks. Similarly, memory cell power supply PMOS transistors Ps11 and Ps21 are provided for respective memory blocks.

Potential levels of gates of memory cell power supply PMOS transistors Ps11 to Ps21 are all controlled by gate potential control circuit 302.

In the above described structure, a layout area of the SRAM can be reduced as the number of memory cell power supply PMOS transistors can be reduced as compared with the case of the third or fourth embodiment.

It is noted that, also in the structure of the fifth embodiment, resistor R21 may be arranged between memory cell power supply PMOS transistor Ps and power supply potential Vcc as in the case of the memory cell power supply source of the second embodiment.

Sixth Embodiment

Figure 15:
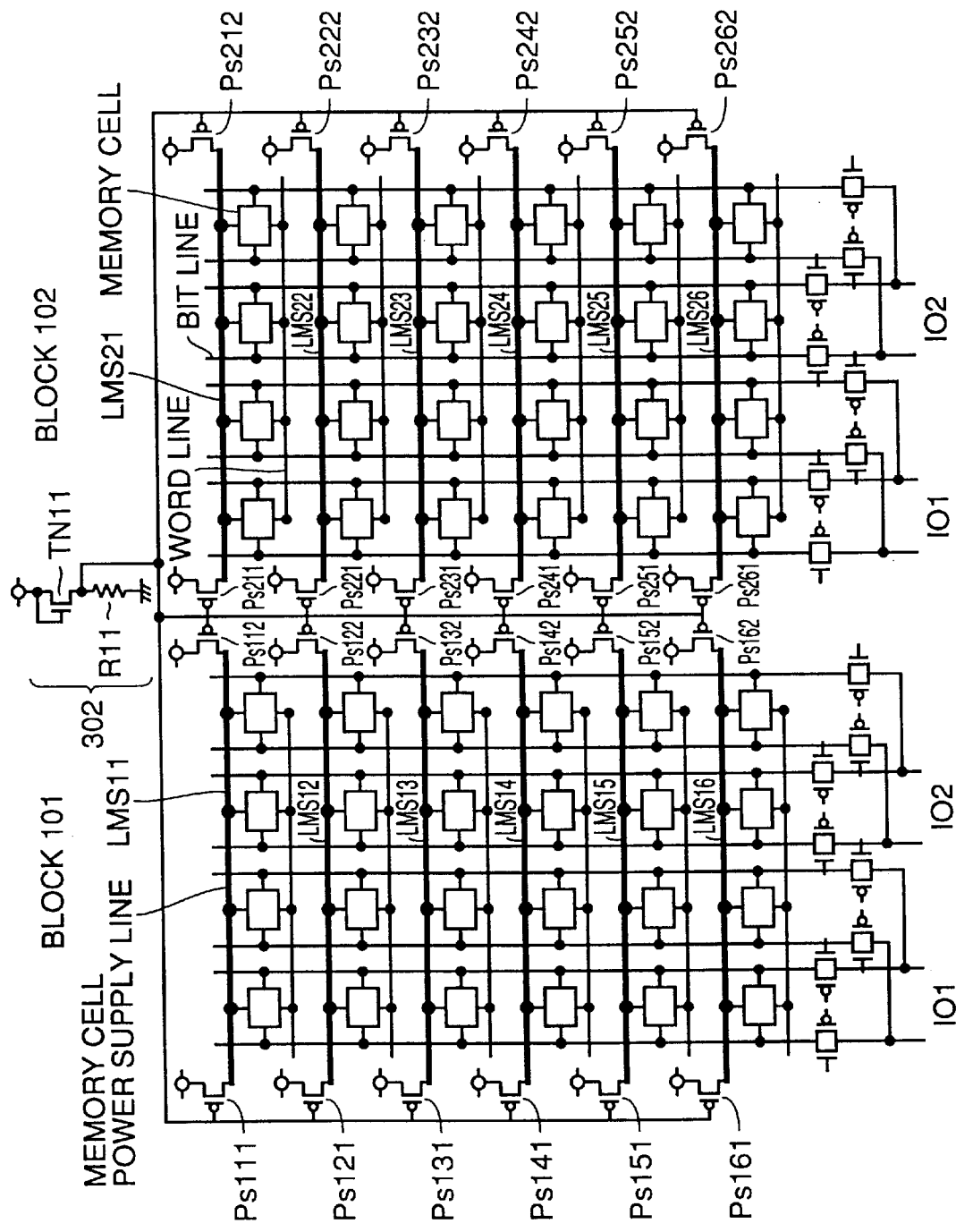
FIG. 15 is a schematic block diagram showing an arrangement of an memory cell power supply PMOS transistor in an SRAM according to a sixth embodiment of the present invention.

FIG. 15 is a schematic block diagram showing an arrangement of memory cell power supply PMOS transistors of an SRAM according to the sixth embodiment of the present invention.

The SRAM of the sixth embodiment is the same as the structure of the SRAM of the third embodiment shown in FIG. 12 except that one more memory cell power supply PMOS transistor is provided for each cell power supply line.

More specifically, cell power supply lines LMS11 to LMS16 are provided for respective memory cell rows of memory block 101, and cell power supply lines LMS21 to LMS26 are provided for respective memory cell rows of memory block 102. Memory cell power supply PMOS transistors Ps111 and Ps112 are provided for cell power supply line LMS11. Generally, memory cell power supply PMOS transistors Psij1 and Psij2 are further provided for cell power supply line LMSij (i, j: natural number, $1 \leq i \leq 6$, $1 \leq j \leq 6$).

It is noted that, more generally, N (N: natural number) memory cell power supply PMOS transistors Psij 1 to PsijN may be provided for one memory cell power supply line LMSij.

In this case, the size of each memory cell power supply PMOS transistor is reduced in accordance with the number (N) of transistors provided for one cell power supply line.

More specifically, when N memory cell power supply PMOS transistors are provided for one cell power supply line, the size of one transistor (or a current value capable of driving one transistor) is reduced to 1/N as compared with the case where one memory cell power supply PMOS transistor is provided for one cell power supply line.

Thus, a variation in dependent manner or in down-converting amount of the memory cell power supply potential in the memory cell array can be reduced.

In the embodiment shown in FIG. 15, memory cell power supply line LMSij is arranged for every row, and memory cell power supply PMOS transistors Psij 1 and Psij2 are arranged at both ends of one memory cell power supply line LMSij.

Accordingly, in this case, a current value for one memory cell power supply PMOS transistor is reduced to half that in the case where one memory cell power supply PMOS transistor is provided for one memory cell power supply line LMSij, as in the third embodiment shown in FIG. 12.

It is noted that although FIG. 15 has been described as having one cell power supply line for every memory cell row, N memory cell power supply PMOS transistors can be provided for every memory cell power supply line when the cell power supply line is arranged for every memory cell column corresponding to the same I/O in each block or when the cell power supply line is arranged for every memory block as shown in FIG. 14.

It is noted that resistor R21 may be arranged between memory cell power supply PMOS transistor Ps and power supply potential Vcc as in the case of the memory cell power supply source of the second embodiment in the structure of the sixth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:

a memory cell array having a plurality of memory cells arranged in a matrix;

a plurality of word lines provided correspondingly to rows of said memory cells;

a plurality of pairs of bit lines provided correspondingly to columns of said memory cells, each of said memory cells including a first access transistor provided between one of said pair of bit lines and a first storage node and controlled by a corresponding one of said word lines, a second access transistor provided between the other of said pair of bit lines and a second storage node and controlled by said corresponding word line, and a latch circuit having said first and second storage nodes, said latch circuit including a first CMOS inverter having an input node connected to said second storage node and an output node connected to said first storage node and a second CMOS inverter having an input node connected to said first storage node and an output node connected to said second storage node; and a cell power supply circuit for generating a memory cell power supply potential supplied to said latch circuit, said cell power supply circuit including at least one cell power supply MOS transistor provided between a power supply potential and an output of said cell power supply circuit, and a gate potential control circuit controllably restricting a gate-source voltage of said cell power supply MOS transistor to at most a prescribed value, and said cell power supply MOS transistor being sized to supply a current value enabling a data writing operation for one of said latch circuits at most.

2. The static semiconductor memory device according to claim 1, wherein said cell power supply MOS transistor is a P channel MOS transistor having a source connected to said power supply potential, and said gate power supply control circuit includes at least one bias diode connected in series between said power supply potential and a gate of said cell power supply MOS transistor, and a first bias resistor provided between the gate of said cell power supply MOS transistor and a prescribed potential lower than said power supply potential.

3. The static semiconductor memory device according to claim 2, wherein said bias diode is a diode-connected MOS transistor, and said prescribed potential is a ground potential.

4. The static semiconductor memory device according to claim 2, further comprising a second bias resistor provided between said power supply potential and said cell power supply P channel MOS transistor.

5. The static semiconductor memory device according to claim 3, wherein said bias diode is a diode-connected MOS transistor, and said prescribed potential is a ground potential.

6. The static semiconductor memory device according to claim 1, further comprising a plurality of cell power supply lines provided correspondingly to rows of said memory cells for transmitting said memory cell power supply potential, said cell power supply MOS transistor being provided correspondingly to each of said cell power supply lines.

7. The static semiconductor memory device according to claim 6, wherein N (N: natural number) said cell power supply MOS transistors are provided correspondingly to each of said cell power supply lines, and each of said cell power supply MOS transistors is sized to supply 1/N of said current value enabling said writing operation at most.

8. The static semiconductor memory device according to claim 1, further comprising a plurality of cell power supply lines arranged correspondingly to columns of said memory cells for transmitting said memory cell power supply potential, and said cell power supply MOS transistor being arranged correspondingly to each of said cell power supply lines.

9. The static semiconductor memory device according to claim 8, wherein N (N: natural number) said cell power supply MOS transistors are provided correspondingly to each of said cell power supply lines, and each of said cell power supply MOS transistors is sized to supply 1/N of said current value enabling said writing operation at most.

10. The static semiconductor memory device according to claim 1, further comprising:

a plurality of data input/output circuits arranged in parallel and capable of performing data transfer, said memory cell array being divided into a plurality of groups of memory cell columns corresponding to said plurality of data input/output circuits; and a plurality of cell power supply lines provided correspondingly to said groups of columns of said memory cells for transmitting said memory cell power supply potential, said cell power supply MOS transistor being provided correspondingly to each of said cell power supply lines.

11. The static semiconductor memory device according to claim 10, wherein N (N: natural number) said cell power supply MOS transistors are provided correspondingly to each of said cell power supply lines, and each of said cell power supply MOS transistors is sized to supply 1/N of said current value enabling said writing operation at most.

12. The static semiconductor memory device according to claim 1, wherein said memory cell array is divided into a plurality of memory blocks capable of being selectively and independently activated, said static semiconductor memory device further comprises a plurality of cell power supply lines arranged correspondingly to said memory blocks for transmitting said memory cell power supply potential, and said cell power supply MOS transistor is provided correspondingly to each of said cell power supply lines.

13. The static semiconductor memory device according to claim 12, wherein N (N: natural number) said cell power supply MOS transistors are arranged correspondingly to each of said cell power supply lines, and each of said cell power supply MOS transistors is sized to supply 1/N of said current value enabling said writing operation at most.

\* \* \* \* \*